(12) United States Patent
Shin et al.

US006936885B2

(10) Patent No.: US 6,936,885 B2
(45) Date of Patent: Aug. 30, 2005

(54) NAND-TYPE FLASH MEMORY DEVICES AND METHODS OF FABRICATING THE SAME

(75) Inventors: Kwang-Shik Shin, Seoul (KR);
Kyu-Charn Park, Pyoungtaek-shi (KR); Heung-Kwun Oh, Kyunggi-do (KR); Sung-Hoi Hur, Seoul (KR);
Sang-Bin Song, Yongin-si (KR);
Jung-Dal Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/921,656

(22) Filed: Aug. 19, 2004

(65) Prior Publication Data

US 2005/0023600 A1 Feb. 3, 2005

Related U.S. Application Data

(60) Continuation-in-part of application No. 10/087,330, filed on Mar. 1, 2002, now Pat. No. 6,797,570, which is a division of application No. 09/678,917, filed on Oct. 4, 2000, now Pat. No. 6,376,876.

(30) Foreign Application Priority Data

Jan. 17, 2000 (KR) .............................................. 00-2039
Jun. 21, 2004 (KR) ............................... 10-2004-0045967

(51) Int. Cl.[7] .............................................. H01L 29/78
(52) U.S. Cl. ........................ 257/315; 257/318; 257/319
(58) Field of Search ................................ 257/315, 318, 257/319, 760, 763, 314

(56) References Cited

U.S. PATENT DOCUMENTS

| 5,280,446 | A | | 1/1994 | Ma et al. .................... 365/185 |
| 5,282,160 | A | * | 1/1994 | Yamagata .............. 365/185.05 |
| 5,656,527 | A | | 8/1997 | Choi et al. ................... 438/258 |
| 5,838,615 | A | | 11/1998 | Kamiya et al. ........ 365/185.12 |
| 5,920,098 | A | * | 7/1999 | Liaw .......................... 257/383 |
| 6,066,528 | A | | 5/2000 | Fazan et al. ................ 438/253 |
| 6,080,624 | A | | 6/2000 | Kamiya et al. ............. 438/257 |
| 6,114,767 | A | | 9/2000 | Nagai et al. ................ 257/758 |
| 6,211,012 | B1 | * | 4/2001 | Lee et al. ................... 438/257 |
| 2002/0115256 | A1 | * | 8/2002 | Lee et al. ................... 438/262 |

* cited by examiner

*Primary Examiner*—Michael Trinh
(74) *Attorney, Agent, or Firm*—Mills & Onello, LLP

(57) ABSTRACT

NAND-type flash memory devices and methods of fabricating the same are provided. The NAND-type flash memory device includes a plurality of isolation layers running parallel with each other, which are formed at predetermined regions of a semiconductor substrate. This device also includes a string selection line pattern, a plurality of word line patterns and a ground selection line pattern which cross over the isolation layers and active regions between the isolation layers. Source regions are formed in the active regions adjacent to the ground selection line patterns and opposite the string selection line pattern. The source regions and the isolation layers between the source regions are covered with a common source line running parallel with the ground selection line pattern.

6 Claims, 27 Drawing Sheets

NAND-TYPE FLASH MEMORY DEVICES AND METHODS OF FABRICATING THE SAME

RELATED APPLICATIONS

This application is a continuation-in-part of U.S. application Ser. No. 10/087,330, filed Mar. 1, 2002, now U.S. Pat. No. 6,797,570, which ia a divisional of U.S. application Ser. No. 09/678,917, filed on Oct. 4, 2000, now U.S. Pat. No. 6,376,876, which relies for priority upon Korean Patent Application No. 2000-2039, filed on Jan. 17, 2000, the contents of which are herein incorporated by reference in their entirety.

This application also claims priority from Korean Patent Application No. 2004-45967, filed on Jun. 21, 2004, the contents of which are herein incorporated by reference in their entirety.

FIELD OF THE INVENTION

This invention relates to semiconductor device and methods of fabricating the same and, more particularly, to NAND-type flash memory devices and methods of fabricating the same.

BACKGROUND OF THE INVENTION

Non-volatile memory devices such as flash memory devices do not lose data stored in their memory cells when the electric power supplied to the device is interrupted. Thus, the flash memory device is widely used in memory cards or the like. Flash memory devices are generally of two types: the NAND-type flash memory device and the NOR-type flash memory device.

A cell array region of the NAND-type flash memory device comprises a plurality of strings. The string typically includes a string selection transistor, a plurality of cell transistors and a ground selection transistor, which are serially connected. The drain region of the string selection transistor is connected to a bit line, and the source region of the ground selection transistor is connected to a common source line.

A cell array region of the NOR-type flash memory device contains a plurality of cell transistors, bit lines and common source lines. Here, only one cell transistor is electrically interposed between the bit line and the common source line.

Accordingly, the NAND-type flash memory device has higher integration density and smaller cell current as compared to the NOR-type flash memory device. The cell current corresponds to current flowing through the bit line and the common source line during a read mode. Thus, it is required to increase the cell current of the NAND-type flash memory device more so than it is in the NOR-type flash memory device. This is because the cell current directly affects access time of the flash memory device. As a result, it is required to decrease electrical resistance of the bit line and/or the common source line in order to improve the access time of the NAND-type flash memory device.

FIG. 1 is a top plan view showing a portion of cell array region of a conventional NAND-type flash memory device. Also, FIG. 2A is a cross-sectional view along the line I—I of FIG. 1, and FIG. 2B is a cross-sectional view along the line II—II of FIG. 1.

Referring to FIGS. 1, 2A and 2B, an isolation layer $1a$ defining a plurality of active regions 1 is formed at a predetermined region of a semiconductor substrate 10. The active regions 1 are defined in parallel to each other. A string selection line pattern $2s$, first to $n^{th}$ word line patterns WP1 to WPn, and a ground selection line pattern $2g$ are formed across the isolation layer $1a$ and the active regions 1. Impurity regions 7, $7d$ and $7s$ are formed at the active regions 1 among the string selection line pattern $2s$, the first to $n^{th}$ word line patterns WP1 to WPn, and the ground selection line pattern $2g$. Here, the impurity region $7d$ formed at one side of the string selection line pattern $2s$ acts as a drain region of the string selection transistor. Also, the impurity region $7s$ formed at one side of the ground selection line pattern $2g$ acts as a source region of the ground selection transistor.

Accordingly, the string selection transistor is formed at a portion at which the string selection line pattern $2s$ and the active region 1 intersect each other. Similarly, the ground selection transistor is formed at a portion at which the ground selection line pattern $2g$ and the active region 1 intersect each other. Also, the cell transistors are formed at portions at which the word line patterns WP1 to WPn and the active region 1 intersect each other. As a result, a string is formed at each active region 1. Here, the string includes the string selection transistor, the cell transistors and the ground selection transistor that are serially connected.

A first interlayer insulating layer 4 is formed on the entire surface of the substrate including the strings. The first interlayer insulating layer 4 is patterned to form common source line contact holes 3 exposing the respective source regions $7s$. A conductive layer filling the common source line contact holes 3, e.g., a doped polysilicon layer, is then formed on the first interlayer insulating layer 4. The conductive layer is patterned to form a common source line 5 covering the common source line contact holes 3. The common source line 5 is electrically connected to the source regions $7s$ through the common source line contact holes 3.

The common source line 5 and the first interlayer insulating layer 4 are covered with a second interlayer insulating layer 6. The second interlayer insulating layer 6 and the first interlayer insulating layer 4 are successively patterned to form bit line contact holes 8 exposing the respective drain regions $7d$. Bit line contact plugs $8a$ are formed in the respective bit line contact holes 8. A metal layer is formed on the entire surface of the resultant structure where the bit line contact plugs $8a$ are formed. The metal layer is then patterned to form a plurality of bit lines 9 covering the respective bit line contact plugs $8a$. The plurality of bit lines 9 cross over the first to $n^{th}$ word line patterns WP1 to WPn.

As described above, according to the conventional technology, the common source line is interposed between the first and second interlayer insulating layers. Thus, the thickness of the common source line should be increased in order to reduce the resistance of the common source line. However, in the event that the thickness of the common source line is increased, the thickness of the second interlayer insulating layer should be also increased in order to enhance the isolation characteristic between the bit lines and the common source line. At this time, the aspect ratio of the bit line contact holes penetrating the first and second interlayer insulating layers is increased. As a result, it is required to minimize the resistance of the common source line as well as the aspect ratio of the bit line contact holes.

SUMMARY OF THE INVENTION

It is therefore a feature of the present invention to provide a NAND-type flash memory device having low resistance in a common source line as well as low aspect ratio of the bit line contact holes. It is another feature of the present invention to provide methods of fabricating a NAND-type flash memory device, which can minimize the aspect ratio of the bit line contact holes and the resistance of the common source line.

These and other features of the present invention may be provided by a NAND-type flash memory device according to the invention. The device of the invention includes a plurality of isolation layers formed at predetermined regions of a semiconductor substrate and running parallel with each other. A string selection line pattern and a ground selection line pattern cross over active regions between the plurality of isolation layers. The string selection line pattern and the ground selection line pattern run parallel with each other. A plurality of word line patterns is disposed between the string selection line pattern and the ground selection line pattern. Source regions are formed at the active regions adjacent to the ground selection line patterns. The source regions are located opposite the string selection line pattern. Drain regions are formed at the active regions adjacent to the string selection line patterns, the drain regions being located opposite the ground selection line pattern. A common source line is disposed on the source regions and the isolation layers between the source regions, the common source line running parallel with the ground selection line pattern and being electrically connected to the source regions.

A plurality of bit lines are disposed across the plurality of word line patterns and the common source line. The respective bit lines are electrically connected to the respective drain regions. A drain contact plug may be interposed between the bit line and the drain region. Also, first and second interlayer insulating layers, which are sequentially stacked, are interposed between the bit lines and the word line patterns. Here, the second interlayer insulating layer is interposed between the bit lines and the common source line.

In one embodiment, the common source line is formed of a doped polysilicon layer and/or a refractory metal polycide layer in order to reduce the resistance of the common source line. Also, the top surface of the common source line may be even with or lower than that of the first interlayer insulating layer.

In accordance with another feature of the present invention, there is provided a method of fabricating a NAND-type flash memory device. This method includes forming a first interlayer insulating layer on an entire surface of a substrate having a plurality of strings which are parallel to each other, patterning the first interlayer insulating layer to form a slit-type common source line contact hole exposing source regions of the respective strings and isolation layers between the source regions, and forming a common source line in the slit-type common source line contact hole. Here, drain regions of the respective strings may be exposed by drain contact holes during formation of the common source line contact hole.

The method of forming the plurality of strings includes forming an isolation layer defining a plurality of active regions which run parallel with each other at a predetermined region of a semiconductor substrate, forming a tunnel oxide layer on the active regions, and forming a string selection line pattern, a plurality of word line patterns, and a ground selection line pattern crossing over the active regions covered by the tunnel oxide layer and isolation layer between the active regions. In addition, the method of forming the plurality of strings includes ion implanting impurities into the active regions among the string selection line pattern, the plurality of word line patterns, and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern.

Alternatively, the plurality of strings may be formed using a self-aligned shallow trench isolation technique. Specifically, this method includes the steps of sequentially forming a tunnel oxide layer and a first conductive layer on a semiconductor substrate. The first conductive layer and the tunnel oxide layer are successively patterned to form a first conductive layer pattern exposing a predetermined portion of the semiconductor substrate. The exposed substrate is etched to form a trench region defining a plurality of active regions, which run parallel with each other. The trench region is filled with an isolation layer. The first conductive layer pattern and the isolation layer are covered with a second conductive layer. The second conductive layer is patterned to form a second conductive layer pattern exposing the isolation layer. An inter-gate dielectric layer and a third conductive layer are sequentially formed on the entire surface of the substrate including the second conductive layer pattern. The third conductive layer, the inter-gate dielectric layer, the second conductive layer pattern and the first conductive layer pattern are successively patterned to form a string selection line pattern, a plurality of word line patterns and a ground selection line pattern crossing over the active regions covered with the tunnel oxide layer and the isolation layer between the active regions. Impurities are ion-implanted into the active regions among the string selection line pattern, the plurality of word line patterns and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern.

In one embodiment, an etch stop layer having an etching selectivity with respect to the first interlayer insulating layer is formed prior to formation of the first interlayer insulating layer. At this time, the method of forming the slit-type common source line contact hole and the drain contact holes includes the steps of patterning the first interlayer insulating layer to selectively expose the etch stop layer on the source regions and the isolation layer between the active regions and the etch stop layer on the drain regions. The exposed etch stop layer is etched, thereby exposing the source regions and the isolation layer between the active regions and concurrently exposing the drain regions. Here, the drain contact holes exposing the respective drain regions may not be formed.

In one embodiment, the common source line is formed by depositing a conductive layer, e.g., a doped polysilicon layer, filling the common source line contact hole, on the entire surface of the substrate including the common source line contact hole and planarizing the conductive layer until the first interlayer insulating layer is exposed. Thus, the top surface of the common source line is even with or lower than that of the first interlayer insulating layer. In addition, a refractory metal silicide layer may be formed on the conductive layer pattern in order to reduce the resistance of the common source line. At this time, in the event that the drain contact holes are formed, a plurality of drain contact plugs are formed in the respective drain contact holes.

Moreover, the method according to the present invention may further includes the steps of forming a second interlayer insulating layer on the entire surface of the substrate having the common source line. The second interlayer insulating layer and the first interlayer insulating layer are successively patterned to form a plurality of bit line contact holes exposing the respective drain regions. A plurality of bit lines covering the respective bit line contact holes are then formed. A plurality of bit line contact plugs may be formed in the respective bit line contact holes prior to formation of the bit lines. In the meantime, in the event that the plurality of drain contact plugs are formed in the respective drain contact holes, the plurality of bit line contact holes expose the respective drain contact plugs. At this time, the bit line contact plug may be interposed between the drain contact plug and the bit line.

In accordance with another aspect, the invention is directed to a NAND-type flash memory device. The device includes: (i) a plurality of isolation layers formed at predetermined regions of a semiconductor substrate and running parallel with each other; (ii) a string selection line pattern and a ground selection line pattern crossing over the plurality of isolation layers and running parallel with each other; (iii) a plurality of word line patterns arranged between the string selection line pattern and the ground selection line pattern; (iv) source regions adjacent to the ground selection line pattern and formed at active regions opposite the string selection line pattern; (v) an interlayer insulating layer covering the entire surface of the substrate where the string selection line pattern, the ground selection line pattern, and the plurality of word lines are formed, and having a slit-type common source line contact hole exposing the source regions and the isolation layers between the source lines; (vi) a barrier insulating layer formed inner sidewalls of the slit-type common source line contact hole; and (vii) a metal common source line formed in the slit-type common source line contact hole where the barrier insulating layer is formed, and electrically connected to the source regions.

In one embodiment, the metal common source line comprises a barrier metal layer conformally formed in the slit-type common source line contact hole and a metal pattern formed on the barrier metal layer to fill the slit-type common source line contact hole.

In one embodiment, the barrier metal layer is formed of a titanium layer and a titanium nitride layer, the titanium layer and the titanium nitride layer being stacked.

In one embodiment, the barrier insulating layer is formed of a silicon nitride layer.

In one embodiment, the source regions in the slit-type common source line contact hole are recessed. The barrier insulating layer can be extended to a lower part to cover the recessed sidewalls of the source regions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
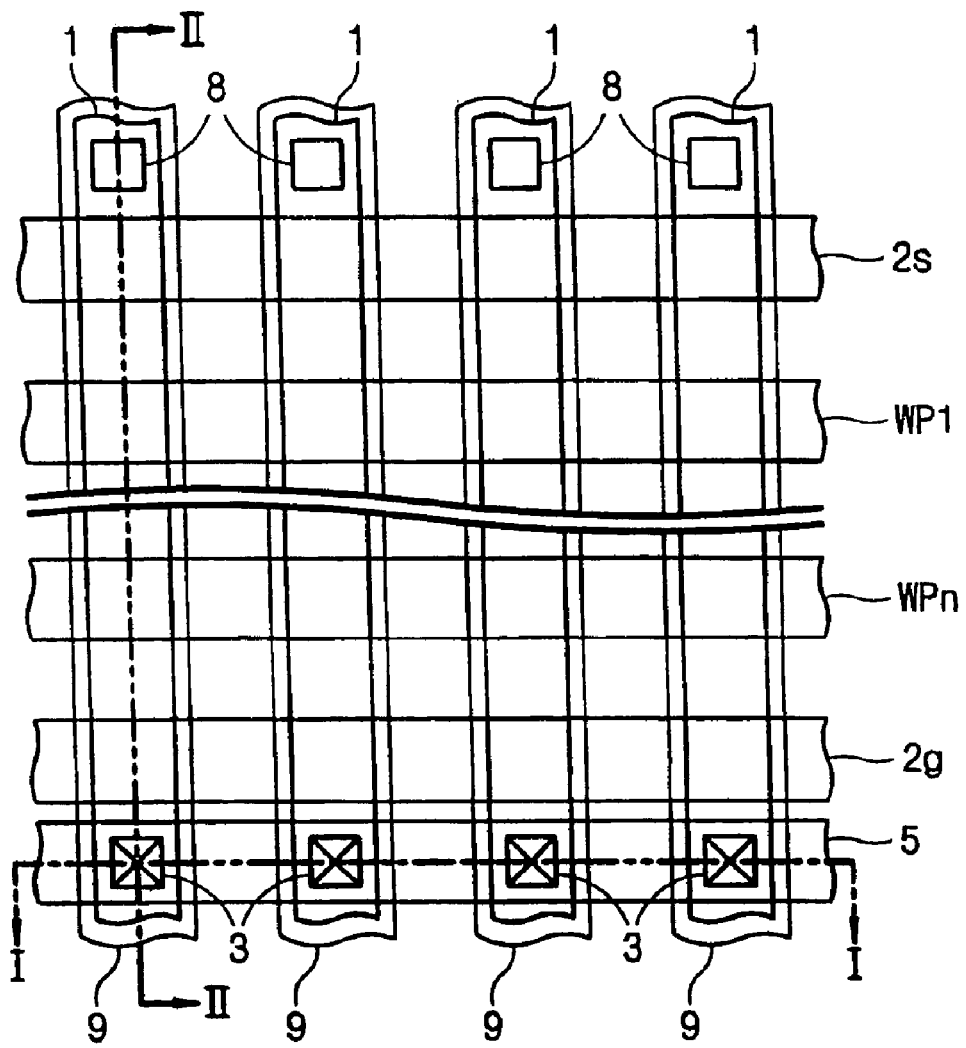
FIG. 1 is a top plan view showing a portion of cell array region of a conventional NAND-type flash memory device.
Figure 2A:
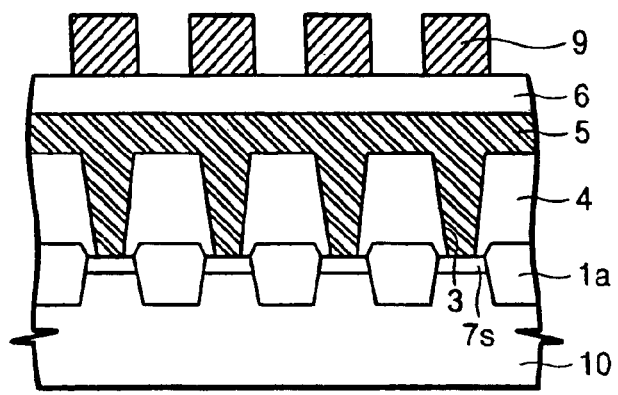
FIG. 2A is a cross-sectional view along the line I—I of FIG. 1.
Figure 2B:
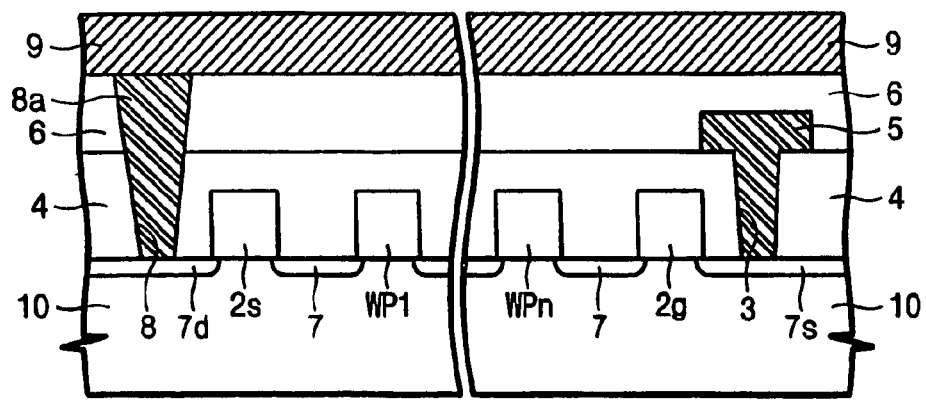
FIG. 2B is a cross-sectional view along the line II—II of FIG. 1.

The present invention will now be described hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention. In the drawings, the thickness of layers and regions are exaggerated for clarity. It will also be understood that when a layer is referred to as being on another layer or substrate, it can be directly on the other layer or substrate, or intervening layers may also be present.

Figure 3A:
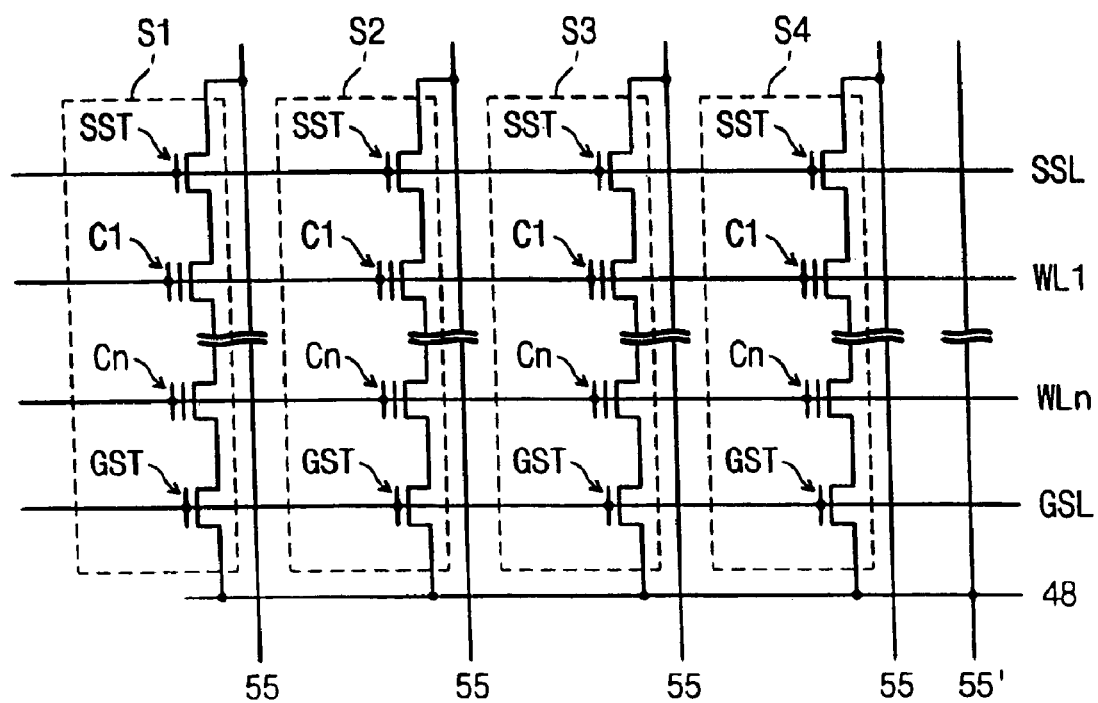
FIG. 3A is an equivalent circuit diagram showing a portion of cell array region of a typical NAND-type flash memory device.

Referring to FIG. 3A, a cell array region of a NAND-type flash memory device includes a plurality of strings, for example, first to fourth strings S1, S2, S3 and S4. Here, each string includes a string selection transistor SST, a plurality of cell transistors C1 to Cn, and a ground selection transistor GST which are serially connected. Each cell transistor has a stacked gate pattern, which includes a floating gate and a control gate electrode. Gate electrodes of the respective string selection transistors SST are electrically connected to a string selection line SSL. Similarly, gate electrodes of the respective ground selection transistors GST are electrically connected to a ground selection line GSL. Also, all the control gate electrodes of the first cell transistors C1 in the plurality of strings are electrically connected to a first word line WL1, and all the control gate electrodes of the $n^{th}$ cell transistors Cn in the plurality of strings are electrically connected to a $n^{th}$ word line WLn. As a result, the string selection line SSL, the plurality of word lines WL1 to WLn, and the ground selection line GSL are disposed in parallel.

Drain regions of the string selection transistors SST are electrically connected to a plurality of bit lines 55 respectively, and source regions of the ground selection transistors GST are electrically connected to a common source line 48. The plurality of bit lines 55 are disposed across the plurality of word lines WL1 to WLn. Also, the common source line 48 runs parallel with the ground selection line GSL. In addition, the common source line 48 is electrically connected to a metal interconnection 55', which runs parallel with the bit lines 55. The metal interconnection 55' acts as an interconnection line for connecting the common source line 48 to a peripheral circuit (not shown).

Figure 3B:
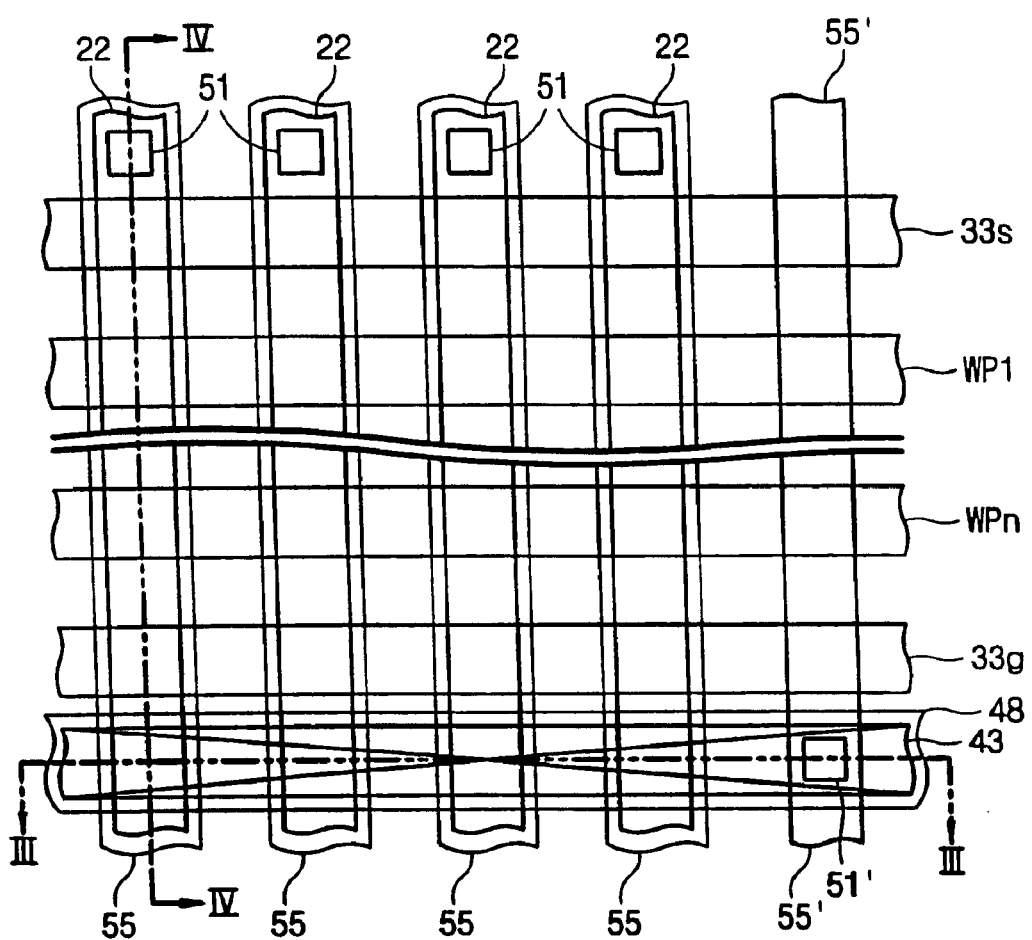
FIG. 3B is a top plan view showing a portion of cell array region of a NAND-type flash memory device according to the present invention.
Figure 4A:
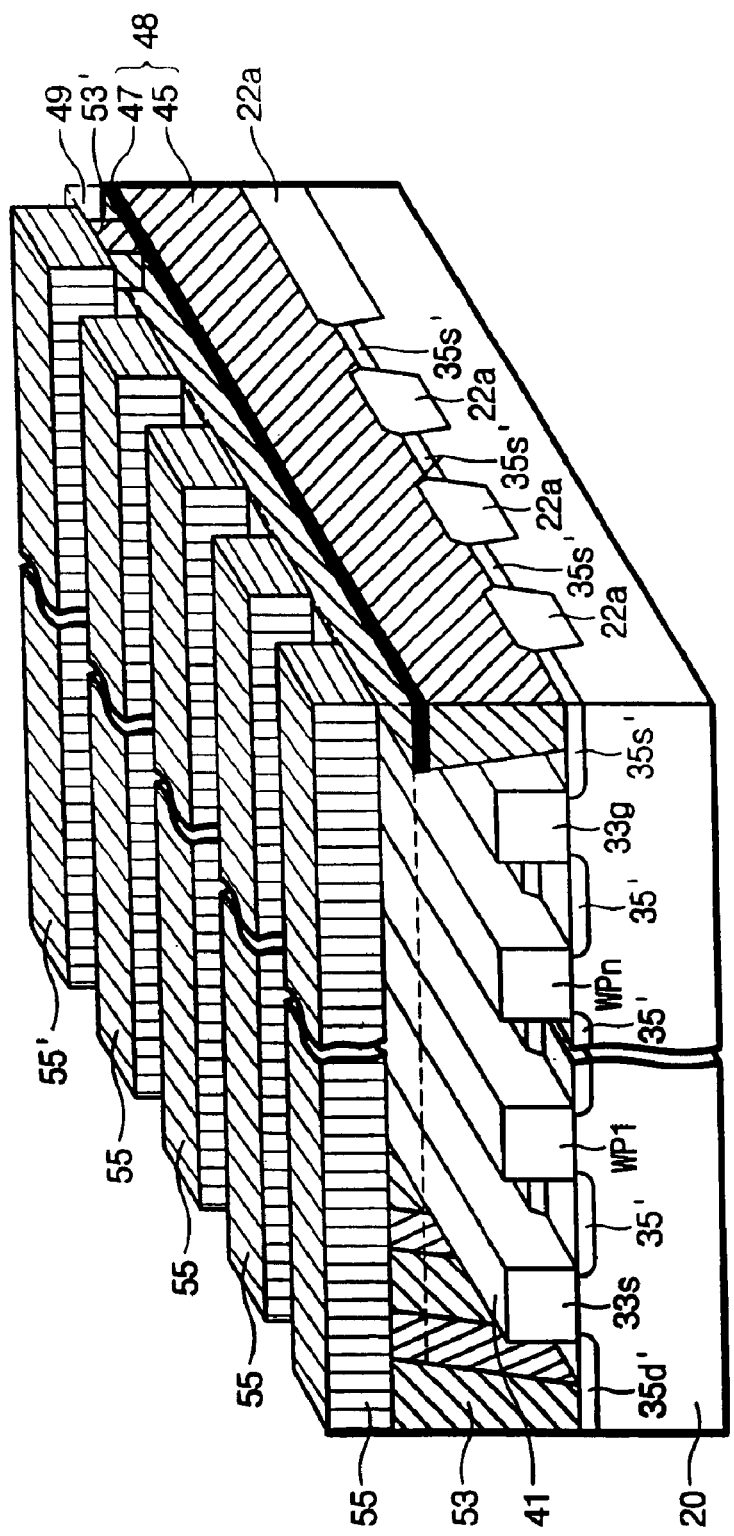
FIG. 4A is a perspective view showing a portion of cell array region of a NAND-type flash memory device according to one embodiment of the present invention.

Referring to FIGS. 3B and 4A, a plurality of active regions 22 are defined in parallel to each other at predetermined regions of a semiconductor substrate 20. The plurality of active regions 22 are defined by forming an isolation layer 22a at a portion of the semiconductor substrate 20. A tunnel oxide layer (not shown) is formed on the active regions 22. A string selection line pattern 33s and a ground selection line pattern 33g cross over the isolation layer 22a and the tunnel oxide layer. Also, a plurality of word line patterns WP1 to WPn are disposed between the string selection line pattern 33s and the ground selection line pattern 33g. Thus, the string selection line pattern 33s, the plurality of word line patterns WP1 to WPn and the ground selection line pattern 33g are disposed in parallel to each other.

The string selection line pattern 33s includes the string selection line (SSL of FIG. 3A), an inter-gate dielectric layer (not shown) and a dummy gate electrode (not shown) which are sequentially stacked. Similarly, the ground selection line pattern 33g includes the ground selection line (GSL of FIG. 3A), an inter-gate dielectric layer (not shown) and a dummy gate electrode (not shown) which are sequentially stacked. Moreover, each word line pattern includes a floating gate (not shown), an inter-gate dielectric layer (not shown) and the word line (WL1, or WLn of FIG. 3A) which are sequentially stacked. Here, the floating gate is located at only the overlapped regions of the active regions 22 and the Word line patterns WP1 to WPn.

Impurity regions 35d', 35' and 35s' are formed at the active regions 22 among the string selection line pattern 33s, the word line patterns WP1 to WPn and the ground selection line pattern 33g. The conductivity type of the impurity regions 35d', 35' and 35s' is different from that of the semiconductor substrate 20. The impurity regions 35d', which are adjacent to the string selection line pattern 33s and opposite the ground selection line pattern 33g, act as drain regions of the respective strings, e.g., the respective string transistors. Similarly, the impurity regions 35s', which are adjacent to the ground selection line pattern 33g and opposite the string selection line pattern 33s, act as source regions of the respective strings, e.g., the respective string transistors.

The string selection line pattern 33s and the ground selection line pattern 33g may be formed of only a string selection line SSL and only a ground selection line GSL respectively. At this time, a gate insulating layer, which is thicker than the tunnel oxide layer, may be interposed between the string selection line SSL and the active regions 22. Also, the gate insulating layer may be interposed between the ground selection line GSL and the active regions 22.

The source regions 35s' and the isolation layer 22a between the source regions 35s' are covered with a common source line 48. The common source line 48 preferably comprises a doped polysilicon layer pattern 45 and a metal silicide layer 47 which are sequentially stacked.

A plurality of bit lines 55 and a metal interconnection 55' cross over the plurality of word line patterns WP1 to WPn and the common source line 48. The plurality of bit lines 55 are electrically connected to the plurality of drain regions 35d' respectively. Also, the metal interconnection 55' is electrically connected to a portion of the common source line 48 through a metal contact hole 51'.

A bit line contact plug 53 may be interposed between the bit line 55 and the drain region 35d'. Also, a metal contact plug 53' may be interposed between the metal interconnection 55' and the common source line 48. A first interlayer insulating layer 41 and a second interlayer insulating layer 49 are sequentially stacked between the plurality of word line patterns WP1 to WPn and the plurality of bit lines 55. The second interlayer insulating layer 49 is interposed between the common source line 48 and the plurality of bit lines 55. Here, the top surface of the common source line 48 has the same height as that of the first interlayer insulating layer 41 or may be lower than that of the first interlayer insulating layer 41.

As a result, the common source line 48 is located in a slit-type common source line contact hole 43 penetrating a portion of the first interlayer insulating layer 41. Accordingly, a cross sectional area of the common source line 48 becomes larger as compared to the conventional art. Moreover, since the top surface of the common source line 48 is not higher than that of the first interlayer insulating layer 41, it is possible to minimize the thickness of the second interlayer insulating layer 49. In addition, since the resistance of the common source line is lower than that of the conventional art, it can minimize the number of the metal interconnection 55'. Therefore, it is possible to increase the integration density of the NAND-type flash memory device as compared to the conventional technology.

Figure 4B:
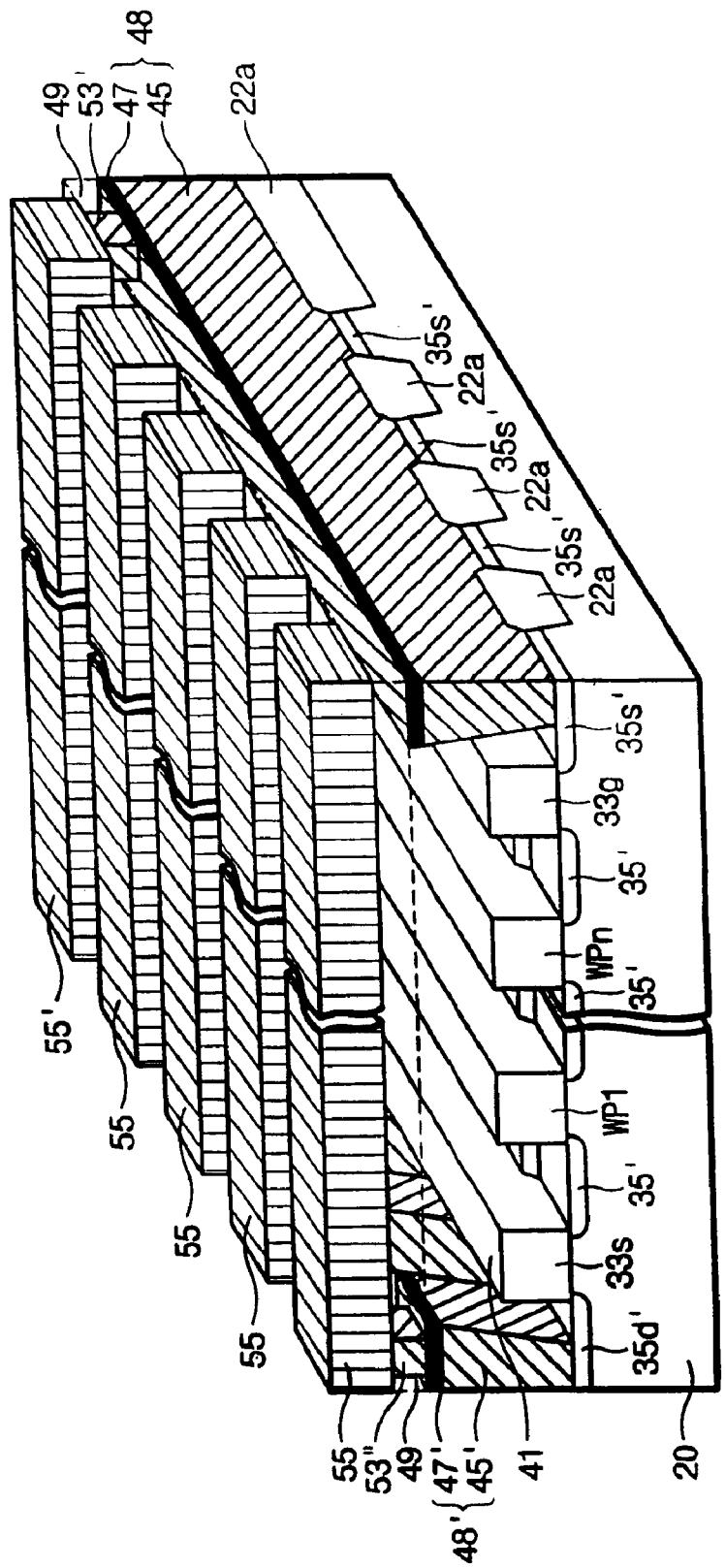
FIG. 4B is a perspective view showing a portion of cell array region of a NAND-type flash memory device according to another embodiment of the present invention.

FIG. 4B is a perspective view showing a structure of the NAND-type flash memory device according to a second embodiment of the present invention. Each bit line 55 of the second embodiment shown in FIG. 4B is electrically connected to the drain region 35d' of each string through a drain contact plug 48' unlike the first embodiment. Specifically, the drain contact plug 48' is formed in a drain contact hole penetrating the first interlayer insulating layer 41. Thus, the top surface of the drain contact plug 48' is not higher than that of the first interlayer insulating layer 41.

Furthermore, the bit line 55 may be electrically connected to the drain contact plug 48' through a bit line contact plug 53' penetrating a portion of the second interlayer insulating layer 49. Alternatively, the bit line 55 may be directly connected to the drain contact plug 48'. Also, the bit line 55 may be directly connected to the drain region 35d'. Here, the drain contact plug 48' preferably comprises a doped polysilicon layer and a metal silicide layer, which are sequentially stacked.

The methods of fabricating a NAND-type flash memory device according to the present invention will be described hereinafter. FIGS. 5A, 6A, 7A and 8A are cross sectional views for illustrating a method of fabricating a NAND-type flash memory device according to one embodiment of the present invention, along the line III—III of FIG. 3B. Also, FIGS. 5B, 6B, 7B and 8B are cross sectional views for illustrating a method of fabricating a NAND-type flash memory device according to one embodiment of the present invention, along the line IV—IV of FIG. 3B.

Figure 5A:
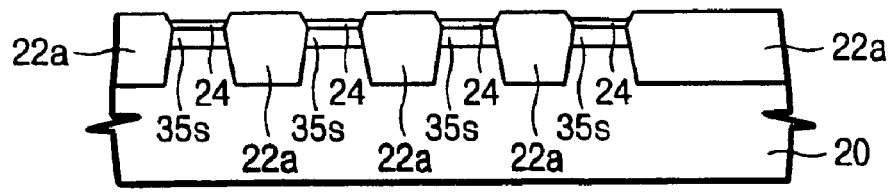
FIGS. 5A, 6A, 7A and 8A are cross-sectional views illustrating a method of fabricating a NAND-type flash memory device according to one embodiment of the present invention, along the line III—III of FIG. 3B.
Figure 5B:
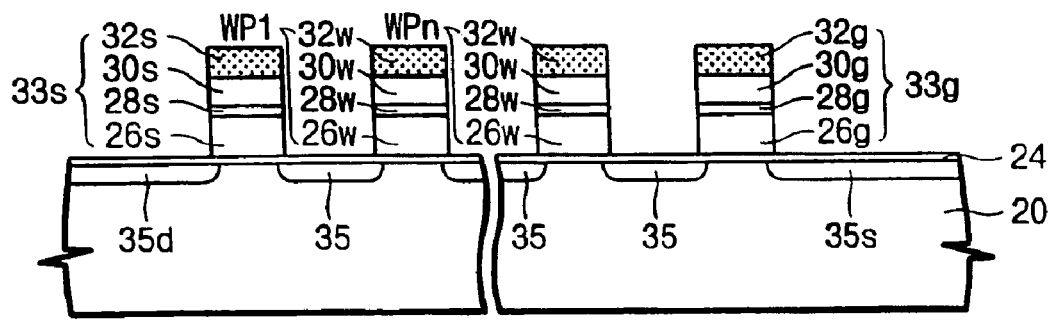
FIGS. 5B, 6B, 7B and 8B are cross-sectional views illustrating a method of fabricating a NAND-type flash memory device according to one embodiment of the present invention, along the line IV—IV of FIG. 3B.

Referring to FIGS. 5A and 5B, an isolation layer 22a is formed at a predetermined region of a semiconductor substrate 20, to thereby defin a plurality of active regions that run parallel with each other. The isolation layer 22a is formed using a conventional isolation technique, for example, a LOCOS (local oxidation of silicon) process or a trench isolation process. A tunnel oxide layer 24 is formed on the active regions. The tunnel oxide layer 24 is preferably formed to a thickness of 100 A or less.

A string selection line pattern 33s, a plurality of word line patterns WP1 to WPn and a ground selection line pattern 33g are formed across the active regions and the isolation layer 22a. The string selection line pattern 33s comprises a string selection line 26s (corresponding to SSL of FIG. 3A), an inter-gate dielectric layer 28s, a dummy gate electrode 30s and capping layer pattern 32s which are sequentially stacked, as shown in FIG. 5B. Similarly, the ground selection line pattern 33g comprises a ground selection line 26g (corresponding to GSL of FIG. 3A), an inter-gate dielectric layer 28g, a dummy gate electrode 30g and capping layer pattern 32g which are sequentially stacked, as shown in FIG. 5B.

Also, each word line pattern WP1, . . . , or WPn comprises a floating gate 26w, an inter-gate dielectric layer 28w, a control gate electrode 30w (corresponding to WL1, . . . , or WLn of FIG. 3A) and capping layer pattern 32w which are sequentially stacked, as shown in FIG. 5B. Here, the floating gate 26w is formed at a portion that the word line pattern is overlapped with the active region. The capping layer patterns 32s, 32w and 32g are all formed of an insulating layer such as a silicon nitride layer, silicon oxynitride layer or silicon oxide layer. The capping layer patterns 32s, 32w and 32g may not be formed.

Subsequently, impurities are ion-implanted into the active regions among the string selection line pattern 33s, the plurality of word line patterns WP1 to WPn and the ground selection line pattern 33g, thereby forming low concentration impurity regions 35d, 35 and 35s. In one embodiment, the low concentration impurity regions 35d, 35 and 35s are formed by implanting the impurities at a low dose of $1 \times 10^{12}$ to $1 \times 10^{12}$ ion atoms/cm$^2$. At this time, conductivity of the impurities is different from that of the substrate 20. Here, the low concentration impurity regions 35d, which are adjacent to the string selection line pattern 33s and opposite the ground selection line pattern 33g, correspond to low concentration drain regions of the respective strings. Similarly, the low concentration impurity regions 35s, which are adjacent to the ground selection line pattern 33g and opposite the string selection line pattern 33s, correspond to low concentration source regions of the respective strings.

Figure 6A:
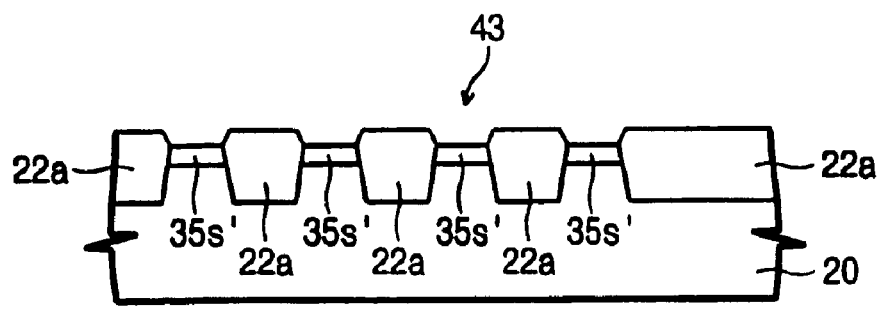
Figure 6B:
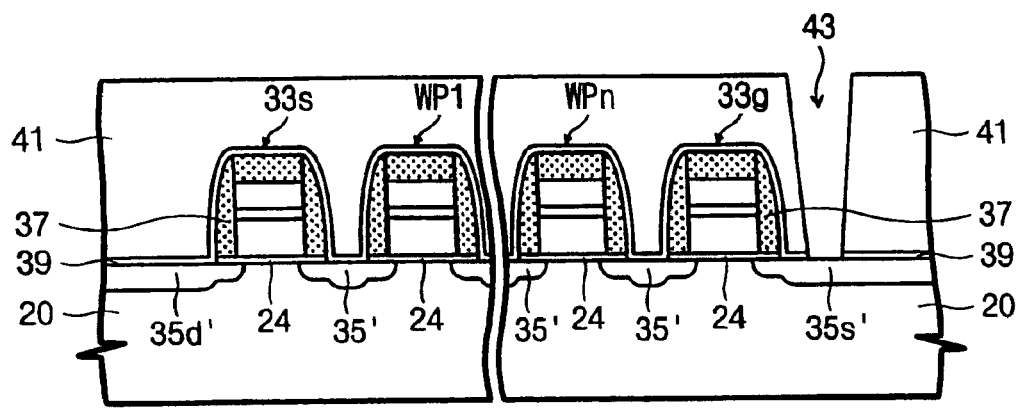

Referring to FIGS. 6A and 6B, spacers 37 are formed on the sidewalls of the string selection line pattern 33s, the plurality of word line patterns WP1 to WPn and the ground selection line pattern 33g. The spacers 37 are formed of a silicon oxide layer or silicon nitride layer. Impurities having the same conductivity type as the low concentration impurity regions are implanted into the low concentration impurity regions using the spacers 37 as ion-implantation masks, thereby forming impurity regions 35d', 35' and 35s'. In one embodiment, the impurities for forming the impurity regions 35d', 35' and 35s' are implanted at a high dose of $5 \times 10^{14}$ to $4 \times 10^{15}$ ion atoms/cm$^2$. Thus, the impurity regions 35d', 35' and 35s' show an LDD (lightly doped drain) structure. The impurity regions 35d' correspond to drain regions of the respective strings, and the impurity regions 35s' correspond to source regions of the respective strings. The ion implantation process for forming the impurity regions 35d', 35' and 35s' may be omitted.

A thin etch stop layer 39 having a thickness of 100 A to 500 A is formed on the entire surface of the resultant structure where the impurity regions 35d', 35' and 35s' are formed. The etch stop layer 39 is preferably formed of a insulating layer having an etching selectivity with respect to a first interlayer insulating layer formed in a subsequent process. For example, the etch stop layer 39 is preferably formed of silicon nitride layer. The substrate including the etch stop layer 39 is covered with a first interlayer insulating layer 41. The first interlayer insulating layer 41 is preferably formed of a planarized BPSG layer or a planarized USG (undoped silicate glass) layer.

The first interlayer insulating layer 41 is patterned to expose the etch stop layer 39 on the source regions 35s' and the isolation layer 22a between the source regions 35s'. The exposed etch stop layer 39 is then etched to form a slit-type common source line contact hole 43 exposing the source regions 35s' and the isolation layer 22a between the source regions 35s'. Accordingly, even though the first interlayer insulating layer 41 is over-etched, it can prevent the isolation layer 22a from being recessed.

Figure 7A:
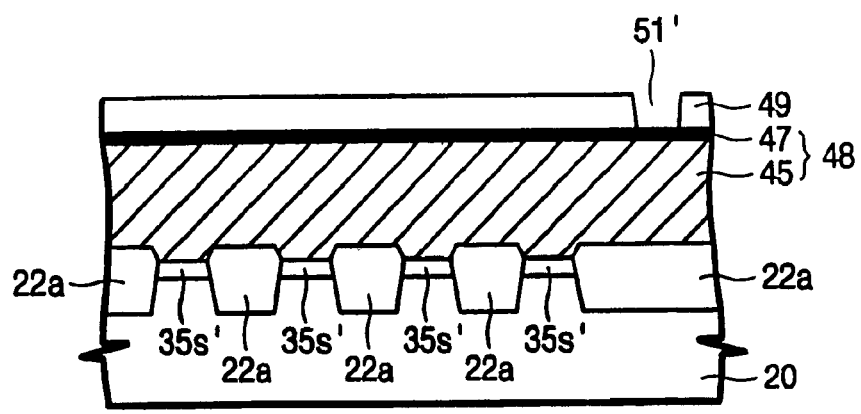
Figure 7B:
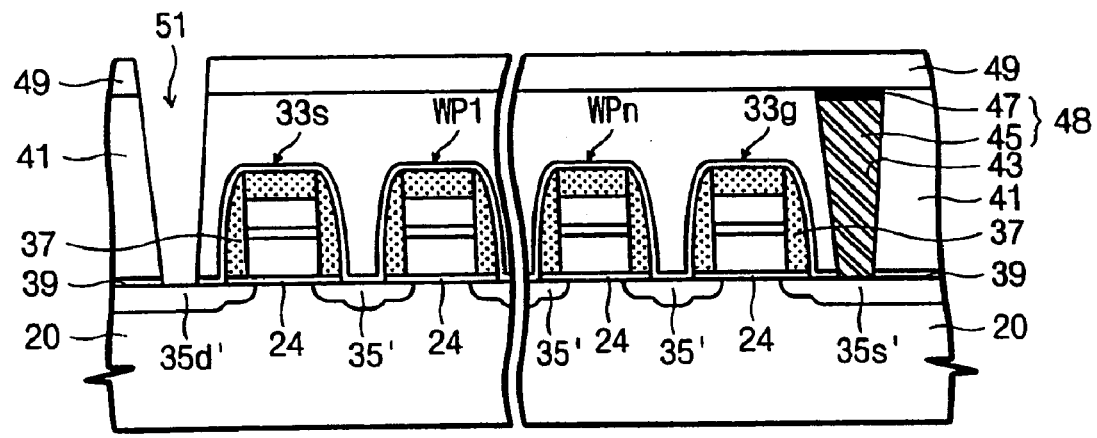

Referring to FIGS. 7A and 7B, the common source line contact hole 43 and the first interlayer insulating layer 41 are covered with a conductive layer filling the common source line contact hole 43. The conductive layer is preferably formed of a doped polysilicon layer showing good step coverage. The conductive layer is etched-back until the top surface of the first interlayer insulating layer 41 is exposed, thereby forming a conductive layer pattern 45, i.e., a polysilicon layer pattern in the common source line contact hole 43. Preferably, a metal silicide layer 47 such as cobalt silicide layer is further formed on the conductive layer pattern 45 using a conventional manner. In this case, it is possible to reduce resistance of the common source line 48 composed of the conductive layer pattern 45 and the metal silicide layer 47. The process for forming the metal silicide layer 47 can be omitted. As a result, the common source line 48, i.e., the conductive layer pattern 45 is formed using a damascene technology. Thus, it can prevent a protrusion due to the common source line 48 from being formed on the first interlayer insulating layer 41.

In the meantime, the common source line 48 may be recessed due to over-etching of the conductive layer. At this time, the upper sidewall of the common source line contact hole 43 may be exposed. The first interlayer insulating layer 41 and the common source line 48 are covered with a second interlayer insulating layer 49 such as a planarized silicon oxide layer. The second interlayer insulating layer 49, the first interlayer insulating layer 41 and the etch stop layer 39 are sequentially patterned to form bit line contact holes 51 exposing the respective drain regions 35d' and a metal contact hole 51' exposing a portion of the common source line 48. At this time, though not shown in the figure, metal contact holes in a peripheral circuit region are also formed.

Figure 8A:
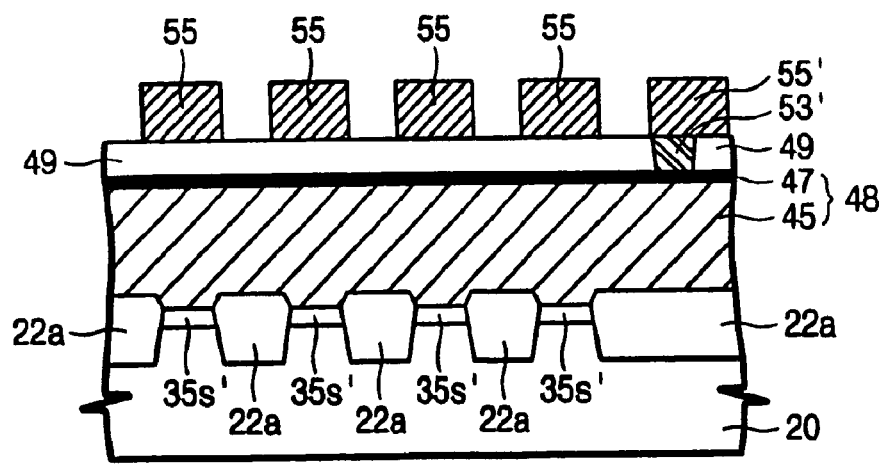
Figure 8B:
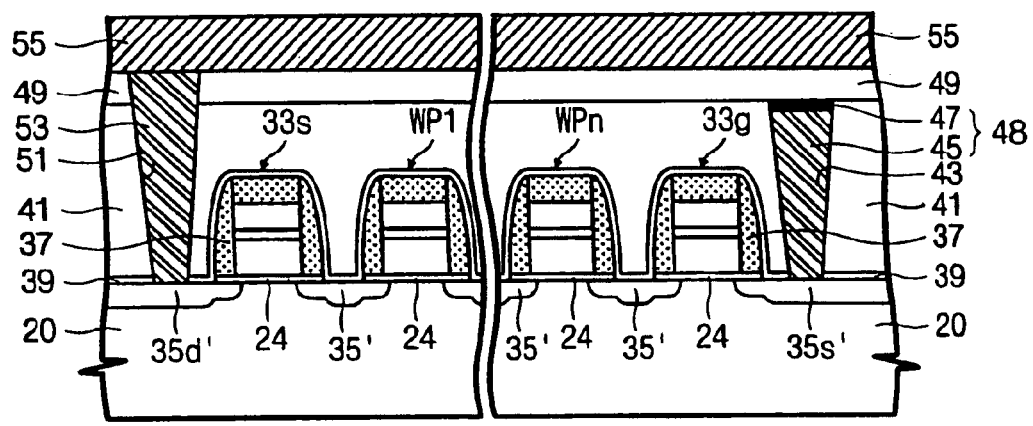

Referring to FIGS. 8A and 8B, a conductive layer such as a doped polysilicon layer, filling the bit line contact holes 51 and the metal contact hole 51', is formed on the second interlayer insulating layer 49. The conductive layer is etched-back until the top surface of the second interlayer insulating layer 49 is exposed, to thereby form bit line contact plugs 53 and a metal contact plug 53' in the respective bit line contact holes 51 and in the metal contact hole 51' respectively. A metal layer such as an aluminum layer is formed on the entire surface of the resultant having the bit line contact plugs 53 and the metal contact plug 53'. The metal layer is patterned to form bit lines 55 being in contact with the respective bit line contact plugs 53 and a metal interconnection 55' being in contact with the metal contact plug 53'. The bit lines 55 and the metal interconnection 55' cross over the plurality of word line patterns WP1 to WPn and the common source line 48.

In the meantime, the process for forming the bit line contact plugs 53 and the metal contact plug 53' may be omitted. At this time, the bit lines 55 and the metal interconnection 55' are in directly contact with the drain regions 35d' and the common source line 48, respectively.

Figure 9A:
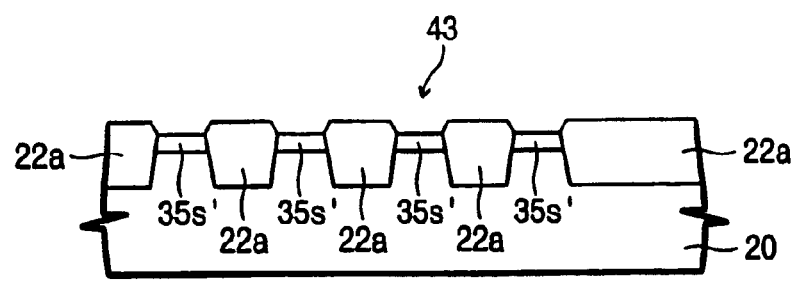
FIGS. 9A, 10A and 11A are cross-sectional views illustrating a method of fabricating a NAND-type flash memory device according to another embodiment of the present invention, along the line III—III of FIG. 3B.
Figure 9B:
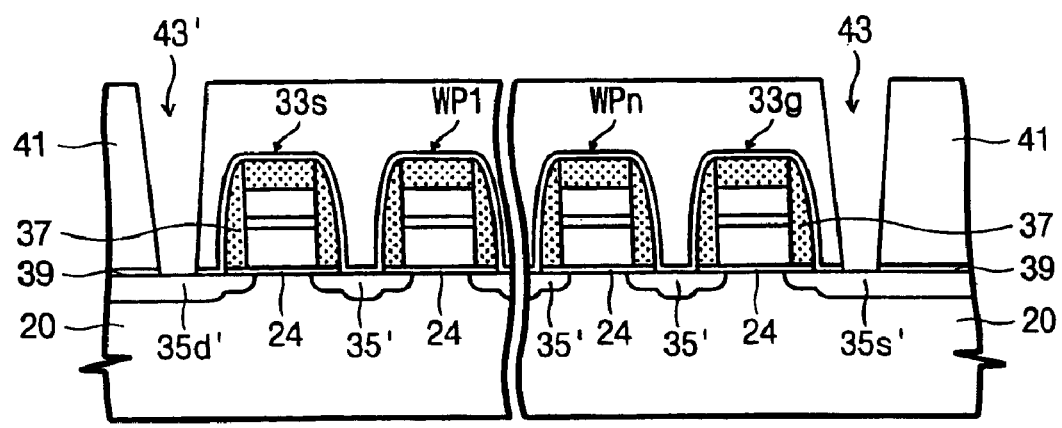
FIGS. 9B, 10B and 11B are cross-sectional views illustrating a method of fabricating a NAND-type flash memory device according to another embodiment of the present invention, along the line IV—IV of FIG. 3B.
Figure 10A:
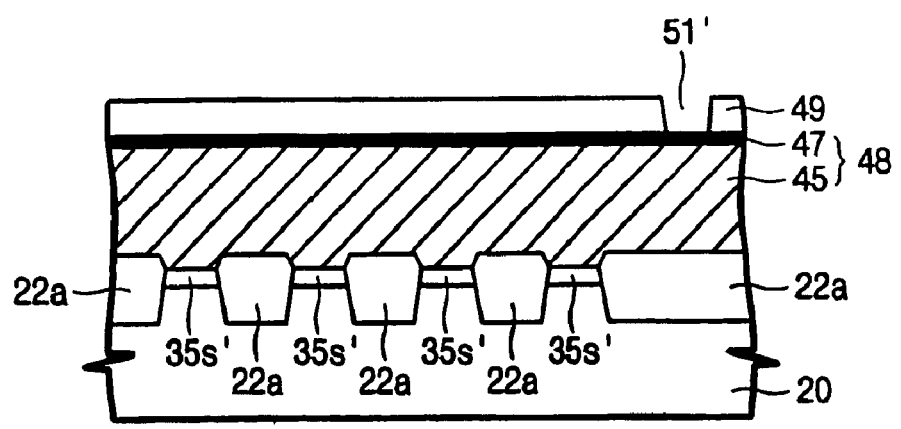
Figure 10B:
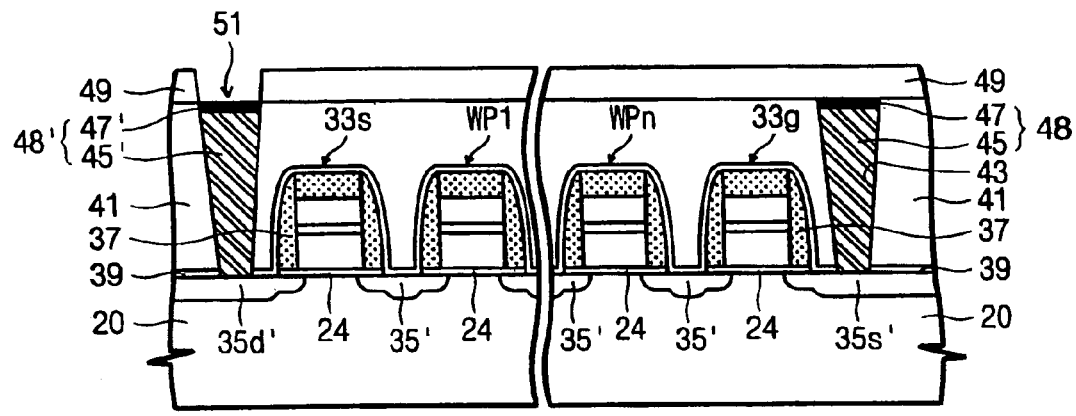
Figure 11A:
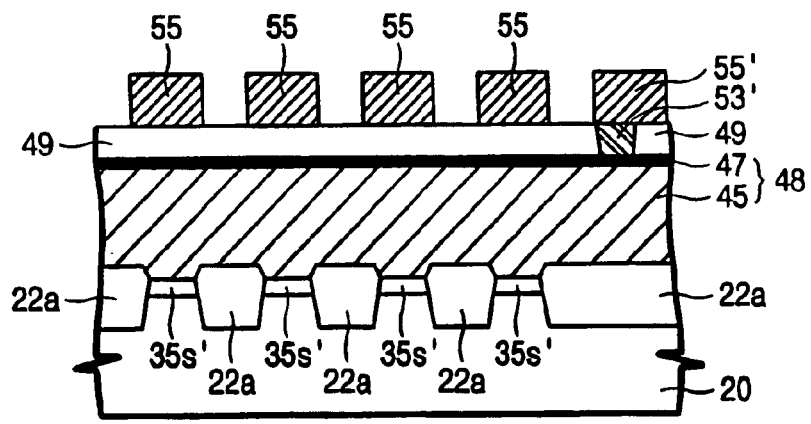
Figure 11B:
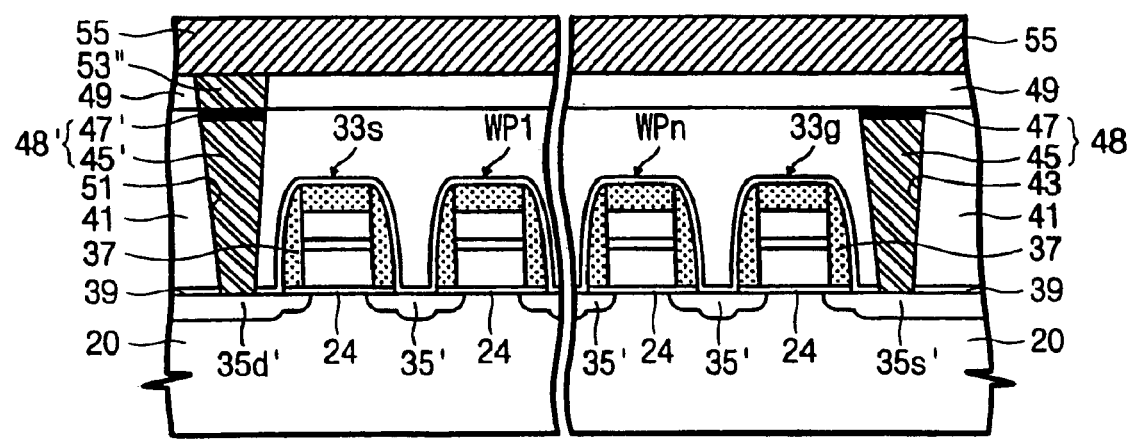

FIGS. 9A, 10A and 11A are cross sectional views for illustrating a method of fabricating a NAND-type flash memory device according to a second embodiment of the present invention, along the line III—III of FIG. 3B. Also, FIGS. 9B, 10B and 11B are cross sectional views for illustrating a method of fabricating a NAND-type flash memory device according to a second embodiment of the present invention, along the line IV—IV of FIG. 3B. Here, the same parts as the first embodiment are indicated with the same reference numbers, and so their explanation will be described briefly or omitted.

Referring to FIGS. 9A and 9B, an isolation layer 22a, a tunnel oxide layer 24, a string selection line pattern 33s, a plurality of word line patterns WP1 to WPn, a ground selection line pattern 33g, impurity regions 35d', 35' and 35s' and spacers 37 are formed using the same manners as in the first embodiment. An etch stop layer 39 and a first interlayer insulating layer 41 are sequentially formed on the entire surface of the substrate including the spacers 37 and the impurity regions 35d', 35' and 35s'. The first interlayer insulating layer 41 and the etch stop layer 39 are successively patterned to form a slit-type common source line contact hole 43 having the same shape as in the first embodiment and to concurrently form drain contact holes 43' exposing the respective drain regions 35d'.

Referring to FIGS. 10A and 10B, a conductive layer, filling the drain contact holes 43' and the common source line contact hole 43, is formed on the first interlayer insulating layer 41. The conductive layer is preferably formed of a doped polysilicon layer like the first embodiment. The conductive layer is planarized until the top surface of the first interlayer insulating layer 41 is exposed, thereby forming a first conductive layer pattern 45 in the common source line contact hole 43 and second conductive layer patterns 45' in the respective drain contact holes 43'.

Preferably, a first and second metal silicide layers 47 and 47' are selectively formed on the first conductive layer pattern 45 and the second conductive layer patterns 45', respectively. In this case, the first conductive layer pattern 45 and the first metal silicide layer 47 constitute a common source line 48, and the second conductive layer pattern 45' and the second metal silicide layer 47' formed thereon constitute a drain contact plug 48'. Thus, it is possible to reduce resistance of the common source line 48 as well as the drain contact plug 48'. The process for forming the first and second metal silicide layers 47 and 47' can be omitted.

Subsequently, a second interlayer insulating layer 49 is formed on the entire surface of the substrate including the common source line 48 and the drain contact plugs 48'. The second interlayer insulating layer 49 is patterned to form bit line contact holes 51 exposing the respective drain contact plugs 48' and a metal contact hole 51' exposing a portion of the common source line 48. At this time, though not shown in the figure, metal contact holes in a peripheral circuit region are also formed.

Referring to FIGS. 11A and 11B, a plurality of bit lines 55 and a metal interconnection 55' are formed on the second interlayer insulating layer 49 using the same manner as in the first embodiment. Thus, the respective bit lines 55 are connected to the respective drain contact plugs 48' through bit line contact plugs 53" or may be directly connected to the respective drain contact plugs 48'. Similarly, the metal interconnection 55' are connected to the common source line 48 through a metal contact plug 53' or may be directly connected to the common source line 48.

Figure 12A:
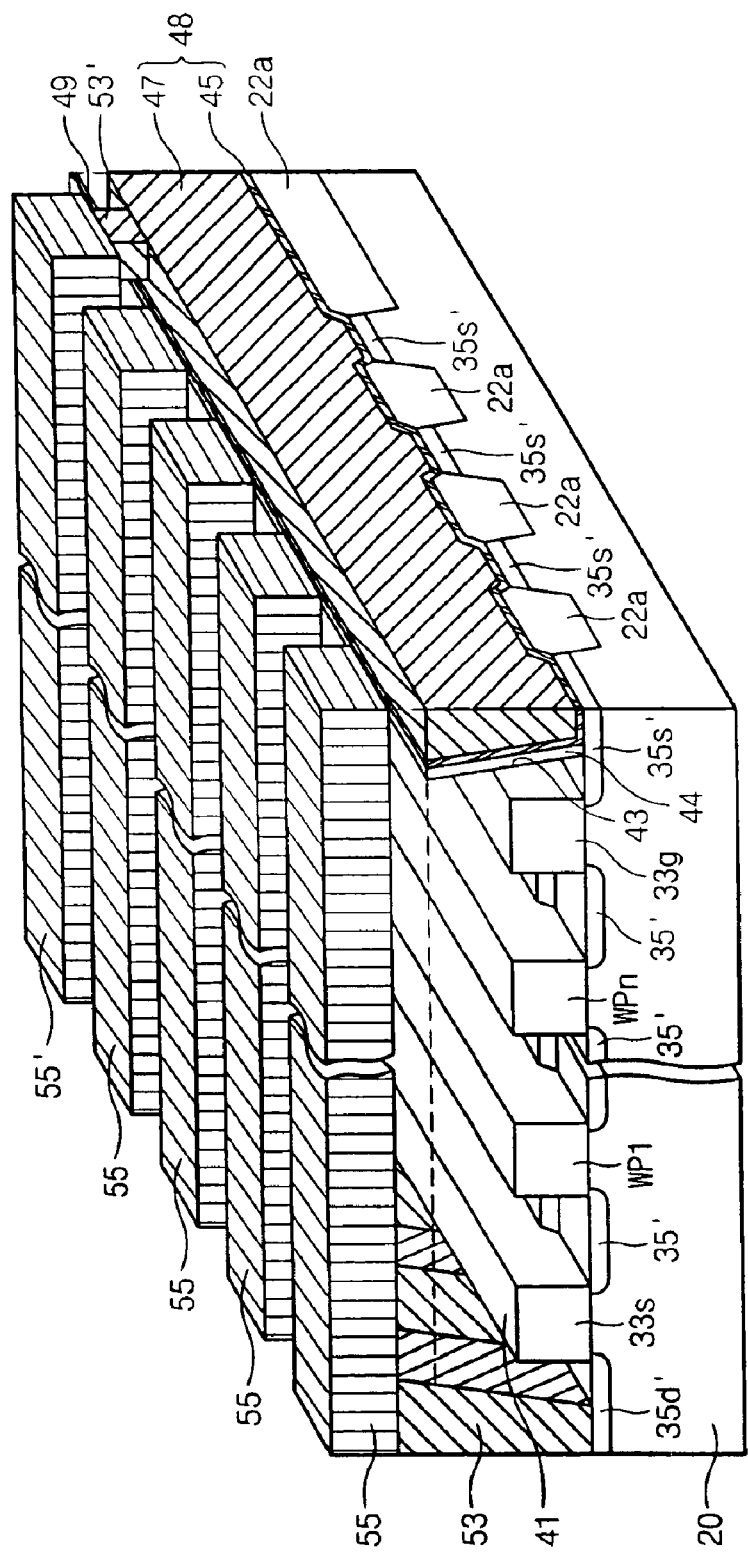
FIG. 12A is a perspective view illustrating a NAND-type flash memory device according to another embodiment of the present invention.

FIG. 12A is a perspective view showing a NAND-type flash memory device according to another embodiment of the present invention.

Referring to FIGS. 3B and 12A, a plurality of isolation layers 22a running parallel with each other are formed at predetermined regions. A tunnel oxide layer (not shown) is formed on active regions 22 between the plurality of isolation layers 22a. A string selection line pattern 33s and a ground selection line pattern 33g are disposed across the isolation layers 22a and the tunnel oxide layer. A plurality of word line patterns, that is, first to $n^{th}$ word line patterns WP1 to WPn are arranged between the string selection line pattern 33s and the ground selection line pattern 33g. Accordingly, the string selection line pattern 33s, first to $n^{th}$ word line patterns WP1 to WPn, and the ground selection line pattern 33g are parallel with each other.

The string selection line pattern 33s comprises a sting selection line, an inter-gate dielectric layer (not shown), and a dummy gate electrode (not shown), which are sequentially stacked. The ground selection line pattern 33g comprises a ground selection line, an inter-gate dielectric layer (not shown), and a dummy gate electrode (not shown), which are sequentially stacked. In addition, each of the word line pattern WP1 to WPn comprises a floating gate (not shown), an inter-gate dielectric layer (not shown), and a word line. In this case, the floating gate is formed at crossing points of each of the active regions and each of the word line patterns.

Impurity regions 35d', 35' and 35s' are formed at the active regions 22 among the string selection line pattern 33s, the plurality of word line patterns WP1 to WPn, and the ground selection line pattern 33g. The impurity regions 35d', 35' and 35s' are doped with different conductive impurities from the semiconductor substrate 20. Drain regions of each of the strings correspond to the impurity region 35d' adjacent to the string selection line pattern 33s and formed at active regions opposite the ground selection line pattern 33g.

In the same way, source regions of each of the strings correspond to the impurity region 35s' adjacent to the ground selection line pattern 33g and formed at active regions opposite the string selection line pattern 33s.

The string selection line pattern 33s and the ground selection line pattern 33g may be constructed with only a string selection line SSL and a ground selection line GSL, respectively. An insulating layer thicker than the tunnel oxide layer may be disposed at a region between the string selection line SSL and the active regions 22, and the ground selection line GSL and the active regions 22. A common source line 48 parallel to the ground selection line pattern 33g is disposed on each of the source regions 35s' and isolation layers 22a between each of the source regions 35s'.

A plurality of bit lines 55 and a source strapping line 55' are disposed across the plurality of word line patterns WP1 to WPn and the common source line 48. Each of bit lines 55 is electrically connected to each of the drain regions 35d'. In addition, the source strapping line 55' is electrically connected to predetermined regions of the common source line 48 through a source strapping contact plug 53'.

A bit line contact plug 53 may be disposed between each of the bit lines 55 and each of the drain regions 35d'. First and second interlayer insulating layers 41 and 49 sequentially stacked are disposed between the plurality of word line patterns WP1 to WPn and the plurality of bit lines 55. In addition, the second interlayer insulating layer is disposed between the common source line 48 and the plurality of bit lines 55.

As a result, the common source line 48 is formed in a slit-type common source line contact hole 43 penetrating a predetermined region of the first interlayer insulating layer 41. A barrier insulating layer 44 is formed at the inner sidewall of the slit-type common source line contact hole 43. The common source line 48 is formed on a barrier metal layer 45 conformally formed in the slit-type common source line contact hole 43, and is constructed with a metal pattern 47 filled in the slit-type common source line contact hole 43. Accordingly, the barrier insulating layer 44 is disposed between the barrier metal layer 45 and the first interlayer insulating layer 41.

According to the present invention, it is possible to improve data retention of a memory cell by disposing the barrier insulating layer 44 between the barrier metal layer 45 and the first interlayer insulating layer 41. The barrier metal layer 45 may be formed of materials containing mobile ions such as a titanium layer and a titanium nitride layer. The barrier insulating layer 44 is disposed between the barrier metal layer 45 and the first interlayer insulating layer 41, so that it is possible to prevent the mobile ions of the barrier metal layer from being diffused to the first interlayer insulating layer 41. Therefore, amphoteric sodium ions are diffused to a memory cell, and thereby preventing information stored in the memory cell from being lost.

It is preferable that the barrier insulating layer 44 be formed of a silicon nitride layer. The metal pattern 47 may be formed of a refractory metal (e.g., tungsten). Since the common source line 48 is formed of a metal layer having a low sheet resistance in comparison with a doped polysilicon, it is possible to provide a high cell current irrespective of narrow sectional area of the common source line. As a result, the integration of the NAND-type flash memory device can be increased in comparison with conventional art.

Figure 12B:
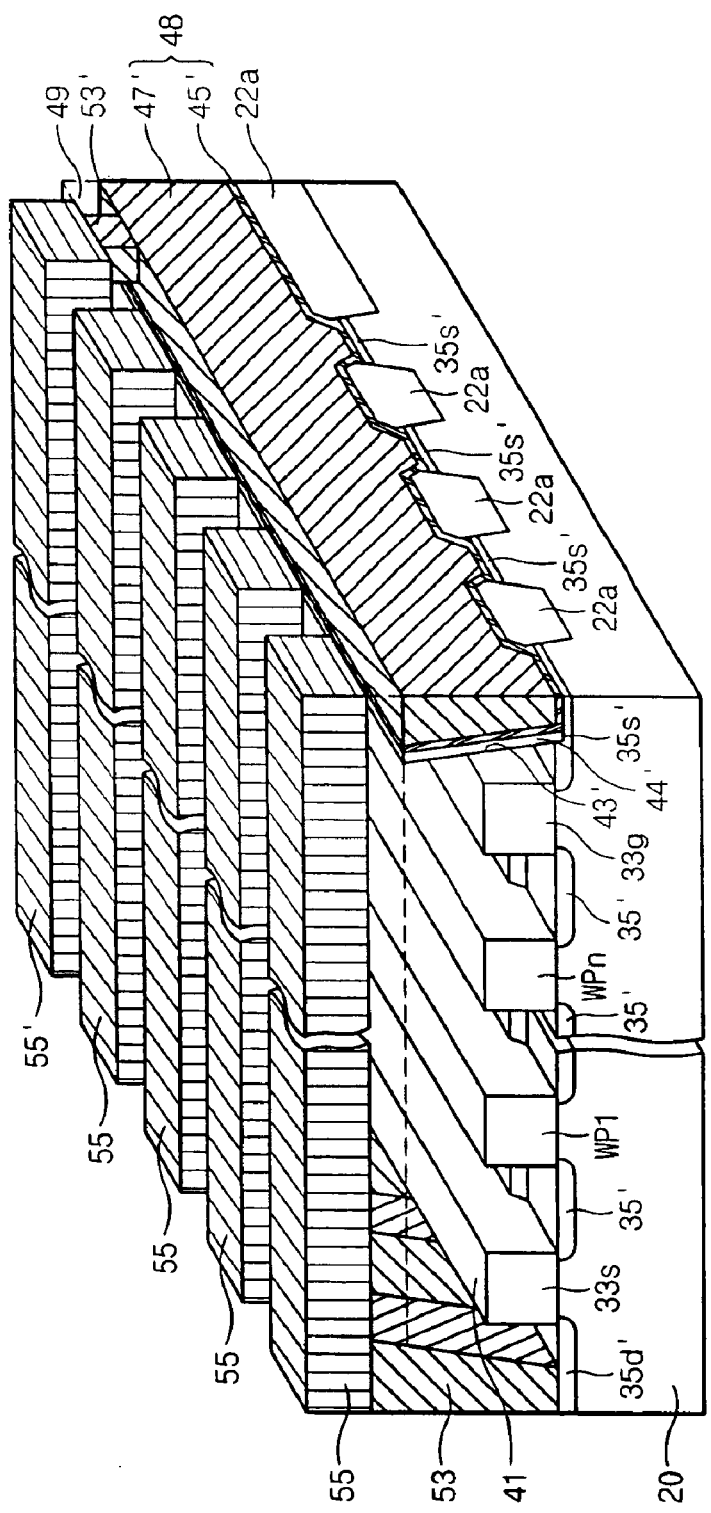
FIG. 12B is a perspective view illustrating a modification of the NAND-type flash memory device of FIG. 12A.

FIG. 12B is a perspective view showing a modification of the embodiment of the invention shown in FIG. 12A.

In the modification shown in FIG. 12B, in contrast the embodiment shown in FIG. 12A, the source regions 35s' in a slit-type common source line contact hole 43' are deeply recessed as compared to a peripheral substrate. Accordingly, the barrier insulating layer 44' is extended from inner sidewalls of the slit-type common source line contact hole 43' to cover the recessed sidewalls of the source regions 35s'. There is a possibility to prevent the mobile ions from being diffused through interfaces between the first interlayer insulating layer 41 and the substrate 20 in accordance with the construction of this embodiment.

A method of fabricating a flash memory device according the present invention is described hereinafter.

FIGS. 13A, 14A, 15A and 16A are cross-sectional views illustrating a method of fabricating the NAND-type flash memory device according to the embodiment of the present invention shown in FIG. 12A, along line III–III' of FIG. 3B.

FIGS. 13B, 14B, 15B and 16B are cross-sectional views illustrating a method of fabricating the NAND-type flash memory device according to the embodiment of the present invention shown in FIG. 12A, along line IV–IV' of FIG. 3B.

Figure 13A:
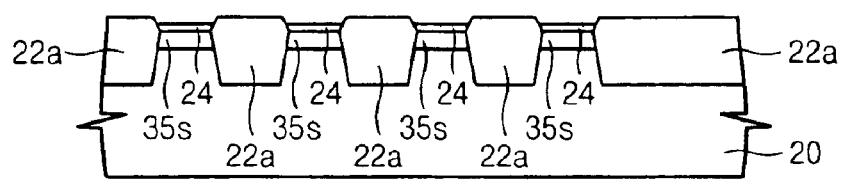
FIGS. 13A, 14A, 15A and 16A are cross-sectional views illustrating a method of fabricating the NAND-type flash memory device according to the embodiment of the present invention shown in FIG. 12A, along line III–III' of FIG. 3B.
Figure 13B:
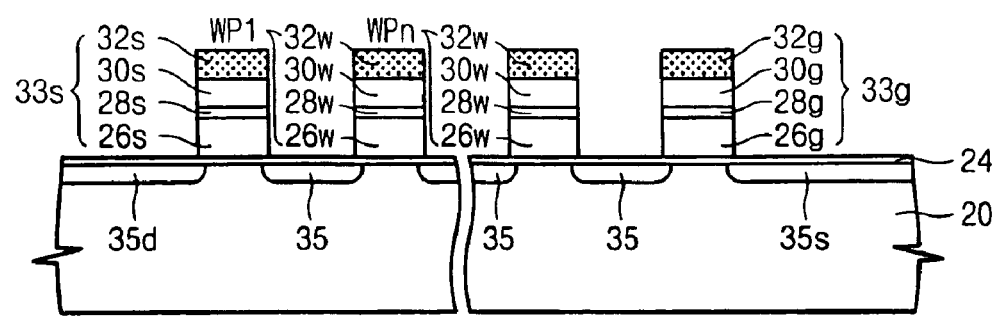
FIGS. 13B, 14B, 15B and 16B are cross-sectional views illustrating a method of fabricating the NAND-type flash memory device according to the embodiment of the present invention shown in FIG. 12A, along line IV–IV' of FIG. 3B.

Referring to FIGS. 13A and 13B, a plurality of isolation layers 22a running parallel with each other are formed at predetermined regions to define an active region. The isolation layers 22a are formed by well-known conventional isolation processes such as a LOCOS (Local Oxidation of Silicon) process and a trench isolation process. A shallow tunnel oxide layer 24 under 100 Å is formed on the active region.

A string selection line pattern 33s, a plurality of word line patterns WP1 to WPn and a ground selection line pattern 33g crossing over the tunnel oxide layer 24 and the isolation layers 22a are formed in a well-known manner. The string selection line pattern 33s, as shown in FIG. 4B, is comprised of a sequentially stacked structure of an inter-gate dielectric layer 28s, a dummy gate electrode 30s and a capping pattern 32s. Similarly, the ground selection line pattern 33g, as shown in FIG. 4B, is comprised of a sequentially stacked structure of a ground selection line 26g, an inter-gate dielectric layer 28g, a dummy gate electrode 30g and a capping pattern 32g.

In addition, each of the word line patterns WP1 to WPn is comprised of a sequentially stacked structure of a floating gate 26w, an inter-gate dielectric layer 28w, a control gate electrode 30w and a capping pattern 32w. In this case, the floating gate 26w is formed at crossing regions of each of the word line pattern WP1 to WPn and the active regions. The capping patterns 32s, 32w and 32g are formed of a silicon nitride layer, a silicon oxynitride or silicon oxide layer. The capping patterns 32s, 32w and 32g may not be formed in some embodiments.

The conductivity type of low concentration impurity regions 35d, 35 and 35s different from that of the semiconductor substrate 20 are formed by implanting the impurities at a low dose of $1\times10^{12}$ ion atoms/cm$^{12}$ to $1\times10^{14}$ ion atoms/cm$^{12}$ using the string selection line pattern 33s, the plurality of word line patterns WP1 to WPn, the ground selection line pattern 33g and the plurality of isolation layers 22a as ion-implantation masks. In this case, a low concentration impurity region 35d adjacent to the string selection line pattern 33s and formed on the active region opposite the ground selection line pattern 33g corresponds to a low concentration drain region of the respective strings. Similarly, a low concentration impurity region 35s adjacent to the ground selection line pattern 33g and formed on the active region opposite the string selection line pattern 33s corresponds to a low concentration source region of the respective strings.

Figure 14A:
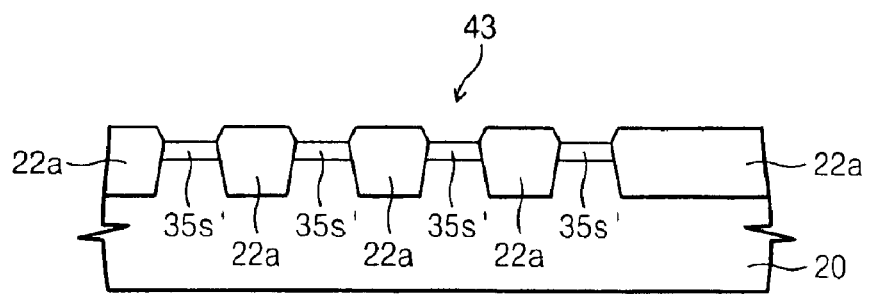
Figure 14B:
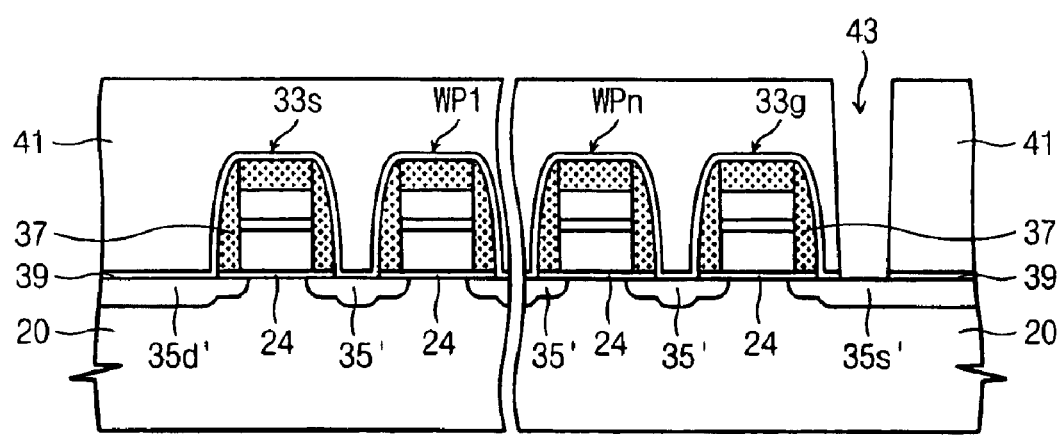

Referring to FIGS. 14A and 14B, spacers 37 are formed on the sidewalls of the string selection line pattern 33s, the plurality of word line patterns WP1 to WPn and the ground selection line pattern 33g. The spacers 37 are formed of a silicon oxide layer or silicon nitride layer. Impurities having the same conductivity type as the low concentration impurity regions are implanted into the low concentration impurity regions using the spacers 37 as ion-implantation masks, thereby forming impurity regions 35d', 35' and 35s'. In one embodiment, the impurities for forming the impurity regions 35d', 35' and 35s' are implanted at a high dose of $5 \times 10^{14}$ ion atoms/cm$^2$ to $5 \times 10^{15}$ ion atoms/cm$^2$. Thus, the impurity regions 35d', 35' and 35s' show an LDD (lightly doped drain) structure. The impurity regions 35d' correspond to drain regions of the respective strings, and the impurity regions 35s' correspond to source regions of the respective strings. The ion implantation process for forming the impurity regions 35d', 35' and 35s' may be omitted.

A thin etch stop layer 39 having a thickness of 100 Å to 500 Å is formed on the entire surface of the resultant structure where the impurity regions 35d', 35' and 35s' are formed. The etch stop layer 39 is preferably formed of a insulating layer having an etching selectivity with respect to a first interlayer insulating layer formed in a subsequent process. For example, the etch stop layer 39 is preferably formed of silicon nitride layer. A first interlayer insulating layer 41 is formed on the entire surface of the resultant structure where the etch stop layer 39 is formed. The first interlayer insulating layer 41 is preferably formed of a planarized BPSG layer or a planarized USG (un-doped silicate glass) layer.

The first interlayer insulating layer 41 is patterned to expose the etch stop layer 39 on the source regions 35s' and the isolation layer 22a between the source regions 35s'. The exposed etch stop layer 39 is then etched to form a slit-type common source line contact hole 43 exposing the source regions 35s' and the isolation layer 22a between the source regions 35s'. Accordingly, even though the first interlayer insulating layer 41 is over-etched, it can prevent the isolation layer 22a from being recessed.

Figure 15A:
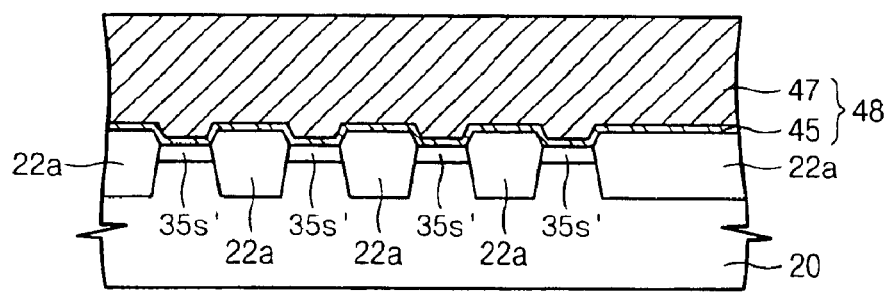
Figure 15B:
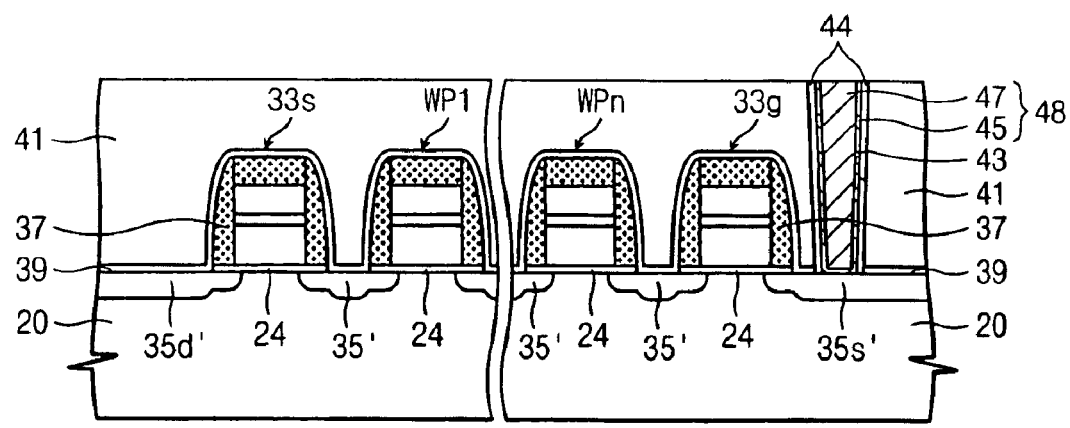

Referring to FIGS. 15A and 15B, after conformally forming an insulating layer on the entire surface of the resultant structure where the slit-type common source line contact hole 43, a barrier insulating layer 44 formed inner sidewalls of the common source line contact hole 43 is formed using an anisotropic etching. The barrier insulating layer 44 may be formed of a silicon nitride layer. A barrier metal layer 45 is conformally formed on the entire surface of the resultant structure. A metal layer filling the common source line contact hole 43 is formed on the barrier metal layer 45. The metal layer and the barrier metal layer 45 are removed by performing a CMP (Chemical Mechanical Polishing) process or an etch-back process to form a metal pattern 47. The metal pattern 47 is formed on the barrier metal layer 45 and the metal pattern 45 conformally covering inner sidewalls of the common source line contact hole 43, the source regions 35s' and the isolation layers 22a to be filled with the common source line contact hole 43. The barrier metal layer 45 has properties for improving a reaction between the metal pattern 47 and the silicon substrate, and an adhesion of a metal layer for forming the metal pattern. For example, the barrier metal layer 45 may be formed of a titanium nitride layer and a titanium layer, which are stacked. The metal pattern is preferably formed of a refractory metal such as tungsten. A common source line 48 comprising the barrier metal layer 45 and the metal pattern 47 has a low electrical resistance in comparison with a conventional common source line formed of doped-polysilicon.

The common source line 48 is covered with the barrier insulating layer 44 in the slit-type common source line contact hole 43. Accordingly, it can prevent mobile ions from being diffused from a barrier metal layer containing amphoteric sodium ions (e.g., Na) into the first interlayer insulating layer 41.

Figure 16A:
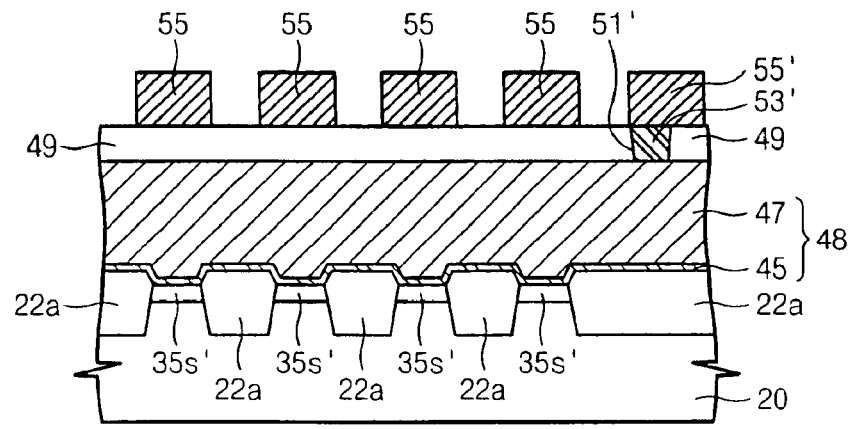
Figure 16B:
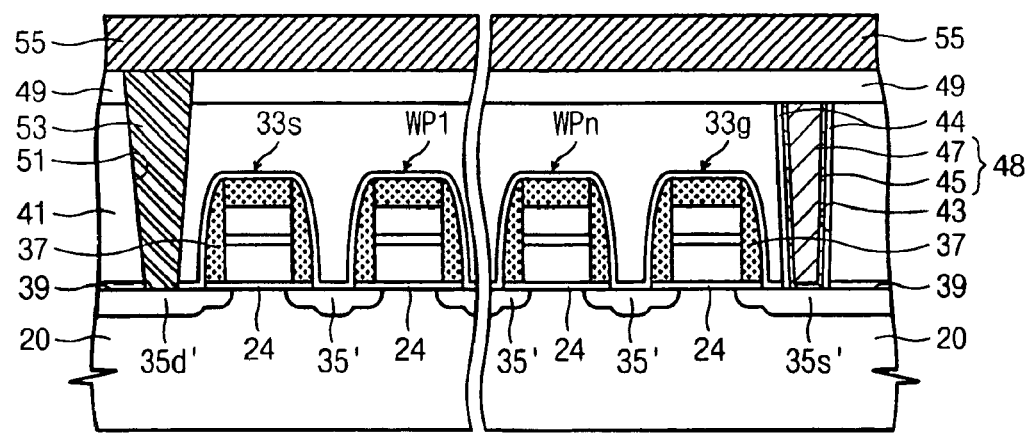

Referring to FIGS. 16A and 16B, a second interlayer insulating layer 49 is formed on the entire surface of the resultant structure where the common source line 48 is formed. The second interlayer insulating layer 49, the first interlayer insulating layer 41 and the etch stop layer 39 are successively patterned to form bit line contact holes 51 exposing the drain regions 35d' and a source contact hole 51' exposing a predetermined region of the common source line 48. At this time, as not shown, contact holes at a peripheral circuit region are also formed simultaneously when the bit line contact holes 51 are formed.

The bit line contact holes 51 and a conductive layer filling the source contact hole 51', that is, a doped-polysilicon layer, are formed on the entire surface of the resultant structure where the bit line contact holes 51 and the source contact hole 51' are formed. Until the second interlayer insulating layer 49 is exposed, the conductive layer is etched-back to respectively form bit line contact hole plugs 53 and a source contact plug 53' in each of the bit line contact holes 51 and the source contact hole 51'. A metal layer such as an aluminum layer is formed on the entire surface of resultant structure where the bit line contact plugs 53 and the source contact plug 53' are formed. The metal layer is patterned to form bit lines 55 contact with the each of the bit line contact plugs 53 and a source strapping line 55' contact with the source contact plug 53'. The bit lines 55 and the source strapping line 55' cross the plurality of word line patterns WP1 to WPn and the common source line 48.

In one embodiment, the process for forming the bit line contact plugs 53 and the source contact plug 53' may be omitted. At this time, each of the bit lines 55 and the source strapping line 55' are directly in contact with each of the drain regions 35d' and the common source line 48, respectively.

Figure 17A:
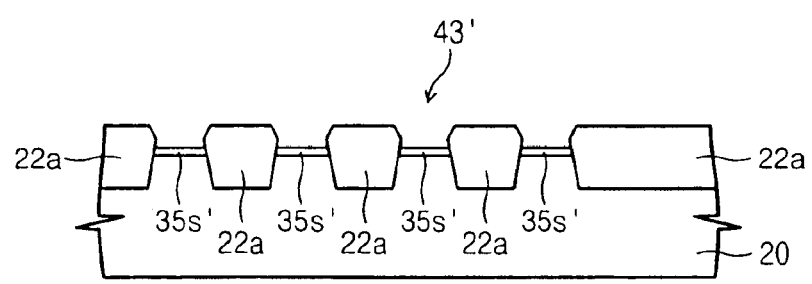
FIGS. 17A, 18A and 19A are cross-sectional views illustrating a method of fabricating the NAND-type flash memory device according to the embodiment of the present invention shown in FIG. 12B, along line III–III' of FIG. 3B.
Figure 17B:
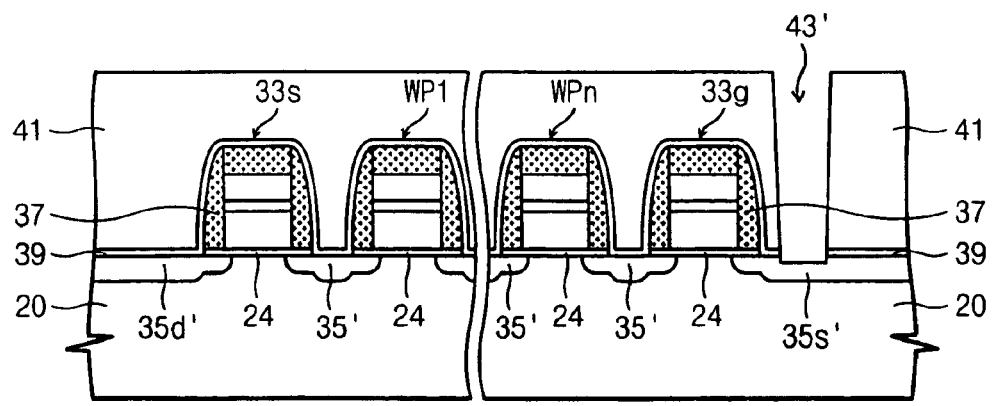
FIGS. 17B, 18B and 19B are cross-sectional views illustrating a method of fabricating the NAND-type flash memory device according to the embodiment of the present invention shown in FIG. 12B, along line IV–IV' of FIG. 3B.
Figure 18A:
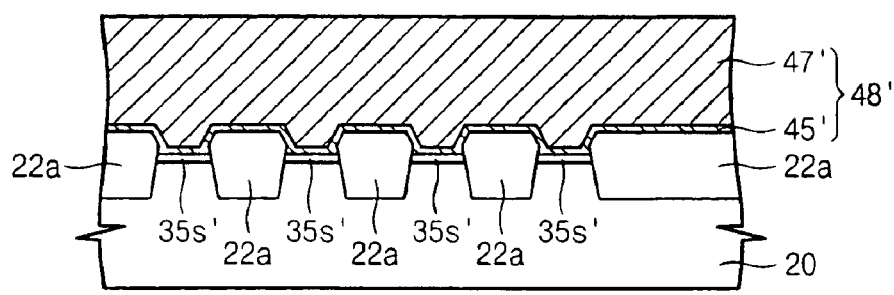
Figure 18B:
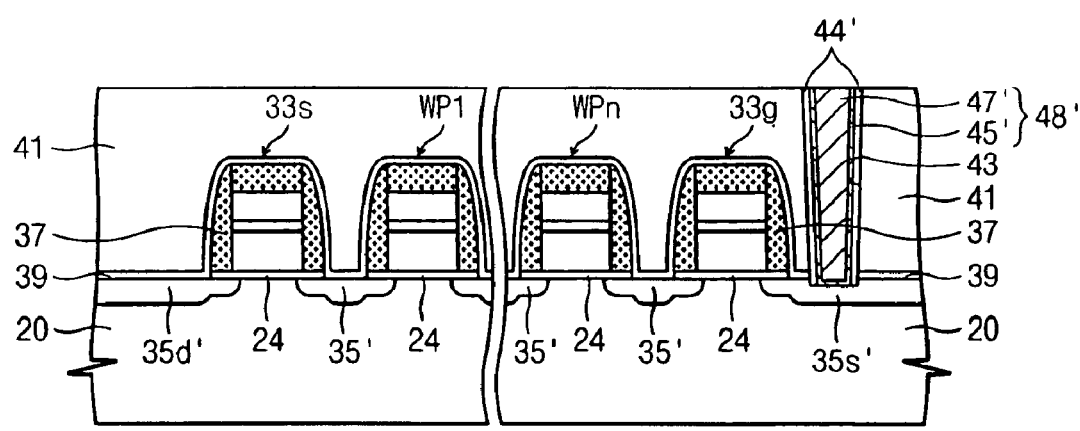
Figure 19A:
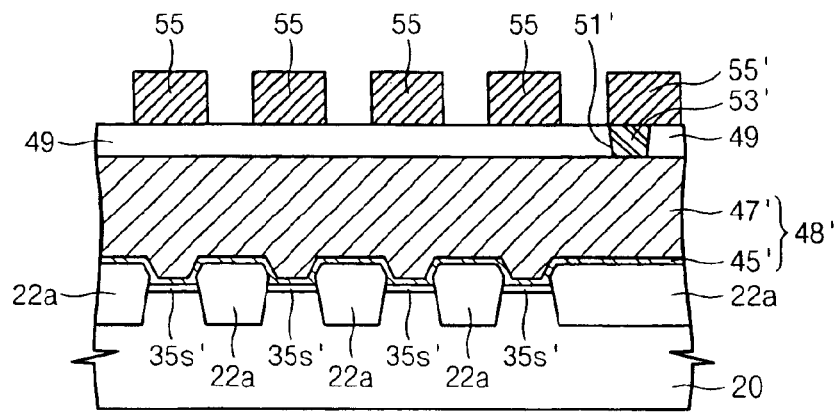
Figure 19B:
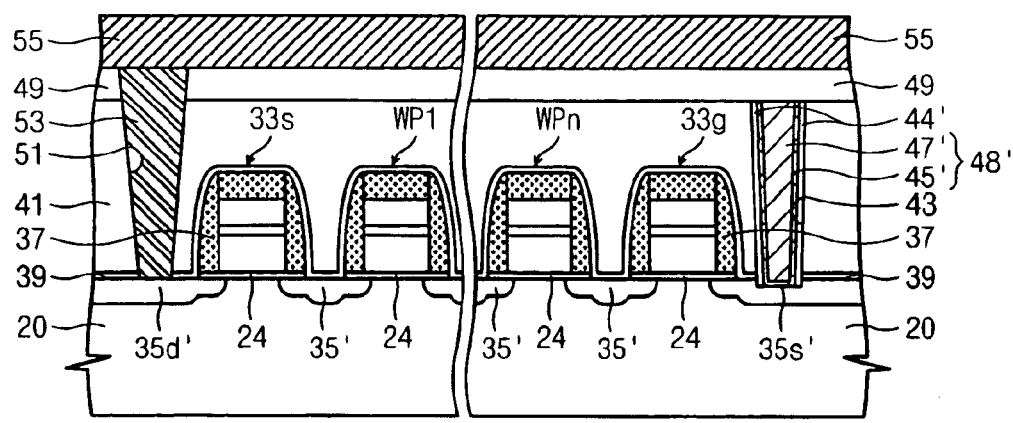

FIGS. 17A, 18A and 19A are cross-sectional views illustrating a method of fabricating the NAND-type flash memory device according to a modification of the embodiment of FIG. 12A, along line III–III' of FIG. 3B. FIGS. 17B, 18B and 19B are cross-sectional views illustrating a method of fabricating the NAND-type flash memory device according to the modification of the embodiment of the present invention of FIG. 12A, along line IV–IV' of FIG. 3B. Here, description of the same components as those of the embodiment described in FIGS. 12A to 16A and 12B to 16B will not be repeated.

Referring to FIGS. 17A and 17B, a spacer 37 is formed on sidewalls of the string selection line pattern 33s, the plurality of word line patterns WP1 to WPn, and the ground selection line pattern 33g.

An etch stop layer 39 and a first interlayer insulating layer 41 are sequentially formed on the entire surface of the resultant structure where the spacer 37 is formed. The first interlayer insulating layer 41 and the etch stop layer 39 are successively patterned to form a slit-type common source line contact hole 43' using the same manner as the first embodiment of the present invention. A part of the substrate where the source regions 35s' are formed is etched to form a recess region lower than the peripheral substrate.

Referring to FIGS. 18A and 18B, a barrier insulating layer 44' is formed on sidewalls of the slit-type common source line contact hole 43'. The barrier insulating layer 44' is extended to sidewalls of the recess region to cover interfaces of the first interlayer insulating layer 41 and the substrate 20. A conformal barrier metal layer 45' is formed on the entire surface of the resultant structure where the barrier insulating layer 44' is formed. A metal layer filling the common source line contact hole 43' is formed on the resultant structure where the barrier metal layer 45' is formed. The metal layer and the barrier metal layer 45' are planarly etched to form a metal pattern 47' filling the common source line contact hole 43'. A common source line 48' comprising the metal pattern 47' and the barrier metal layer 44' is surrounded with the barrier insulating layer 44'. Accordingly, it can prevent amphoteric mobile ions (e.g., Na) from being diffused from the barrier metal layer 44' to the first interlayer insulating layer 41. In addition, since the barrier insulating layer 44' covers interfaces of the first interlayer insulating layer 41 and the substrate 20, mobile ions are prevented from being diffused.

Referring to FIGS. 19A and 19B, a second interlayer insulating layer 49 is formed on the entire surface of the resultant structure where the common source line 48' is formed. The second interlayer insulating layer 49, the first interlayer insulating layer 41 and the etch stop layer 39 are successively patterned to form bit line contact holes 51 exposing the drain regions 35d' and a source contact hole 51' exposing a predetermined region of the common source line 48'. At this time, though not shown in the figures, contact holes of a peripheral circuit region is also formed simultaneously when the bit line contact holes 51 are formed.

A conductive layer filling the bit line contact holes 51 and the source contact hole 51', that is, a doped-polysilicon layer, is formed on the entire surface of the resultant structure with the bit line contact holes 51 and the source contact hole 51'. Until the second interlayer insulating layer 49 is exposed, the conductive layer is etched-back to respectively form contact plugs 53 and source contact plug 53' in the each of the bit line contact holes 51 and the source contact hole 51'. A metal layer such as an aluminum layer is formed on the entire surface of the resultant structure where the bit line contact holes 51 and the source contact hole 51' are formed. The metal layer is patterned to form bit lines 55 in contact with each of the bit line contact plugs 53 and a source strapping line 55' in contact with the source contact plug 53'. The bit lines 55 and the source strapping line 55' cross the plurality of word line patterns WP1 to WPn and the common source line 48.

The process for forming the bit line contact plugs 53 and the source contact plug 53' may be omitted. Each of the bit lines 55 and the source strapping line 55' are directly in contact with the each of the drain regions 35d' and the common source line 48, respectively.

Figure 20A:
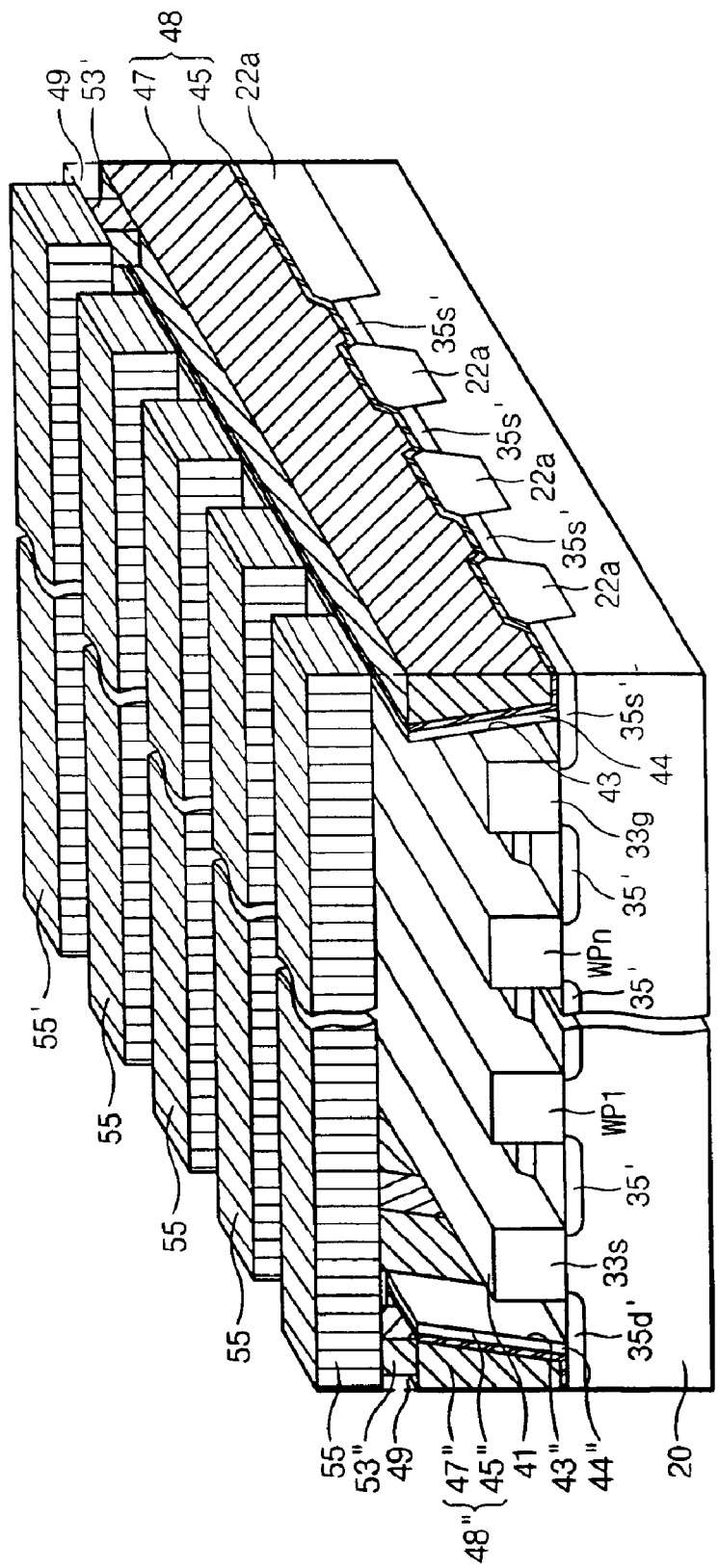
FIGS. 20A and 20B are perspective views illustrating a structure and a modification of a NAND-type flash memory device according to another embodiment of the present invention.
Figure 20B:
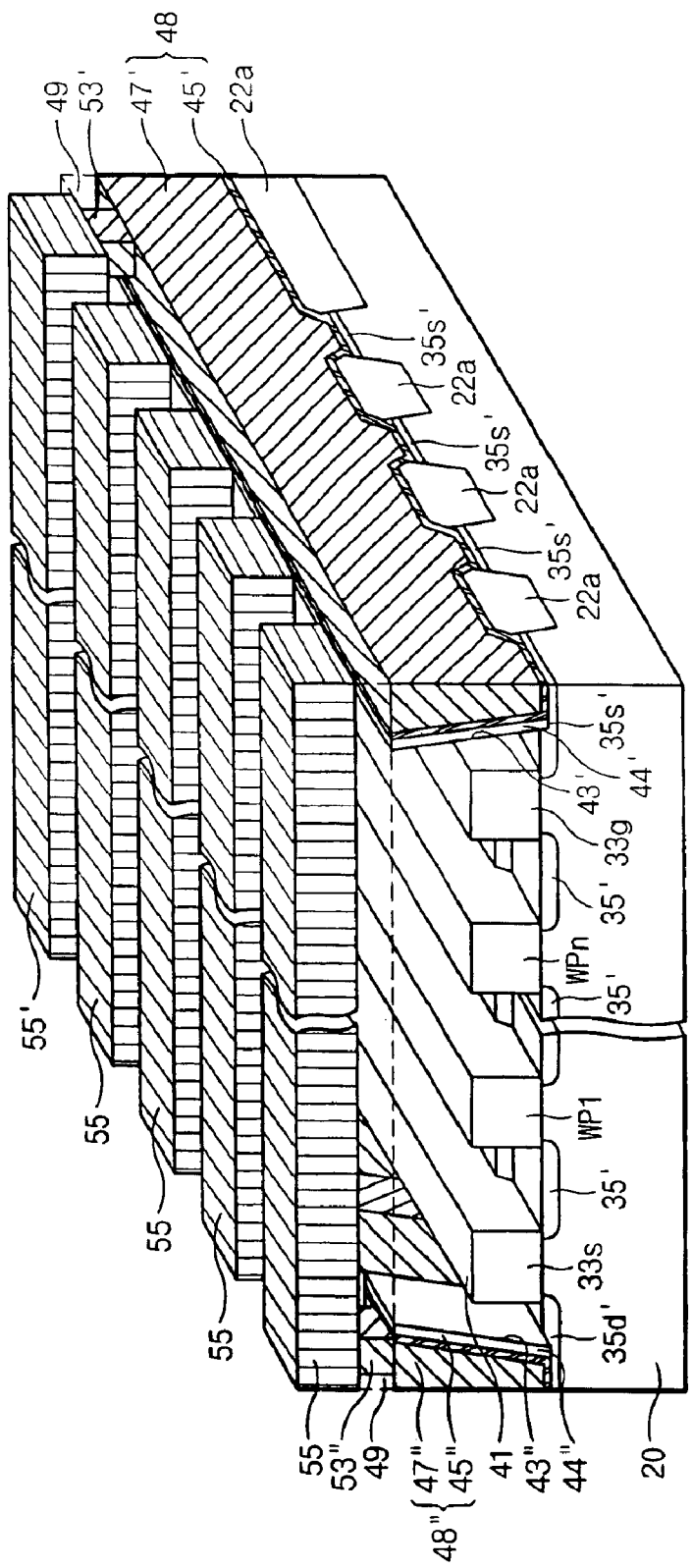

FIGS. 20A to 20B are perspective views illustrating a NAND-type flash memory device and a modification of the device according to another embodiment of the present invention. Here, the same elements as FIGS. 12A and 12B are indicated with the same reference members, and description of the same components as the embodiment described in FIGS. 12A and 12B will not be repeated.

In contrast with the embodiment of the present invention shown in FIGS. 12A and 12B, in the embodiment of FIGS. 20A and 20B, each of the bit lines 55 is electrically connected to the drain region 35d' of the respective string by a drain contact plug 48". More specifically, the drain contact plug 48" is formed in a drain contact hole 43" penetrating a first interlayer insulating layer 41. Like a common source line, the drain contact plug 48" comprises a barrier metal layer 45" conformally formed in the drain contact hole and a metal pattern 47" filling the drain contact hole. Additionally, in order to prevent mobile ions from being diffused the first interlayer insulating layer 41, a barrier insulating layer 44" is formed on sidewalls of the drain contact hole 43". A bit line contact plug 53" penetrating a second interlayer insulating layer 49 may be disposed between the respective bit line 55 and the respective drain contact plug 48".

Figure 21A:
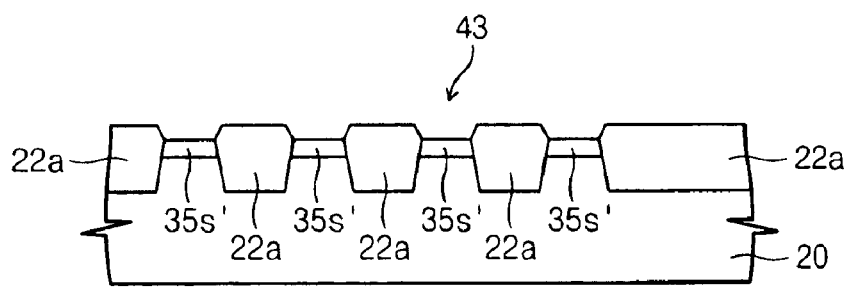
FIGS. 21A, 22A and 23A are cross-sectional views illustrating a method of fabricating the NAND-type flash memory device according to the embodiment of the present invention shown in FIGS. 20A and 20B, along line III–III' of FIG. 3B.
Figure 21B:
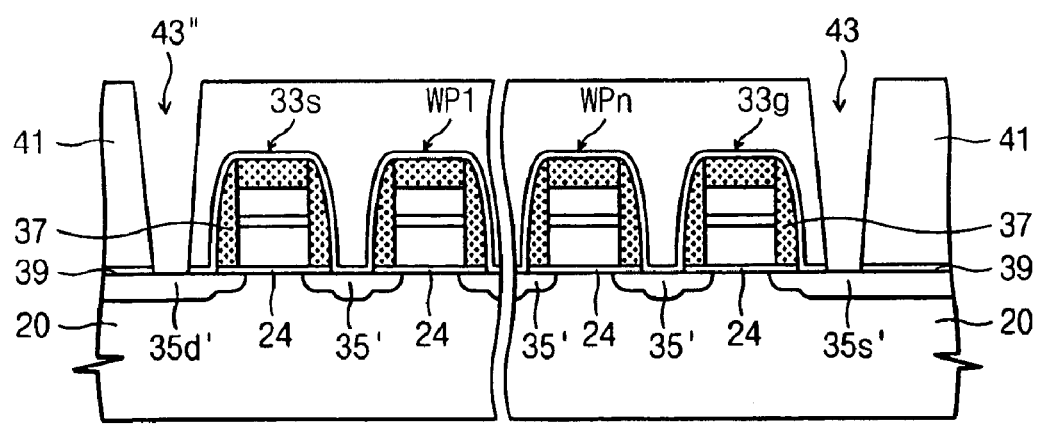
FIGS. 21B, 22B and 23B are cross-sectional views illustrating a method of fabricating the NAND-type flash memory device according to the embodiment of the present invention shown in FIGS. 20A and 20B, along line IV–IV' of FIG. 3B.
Figure 22A:
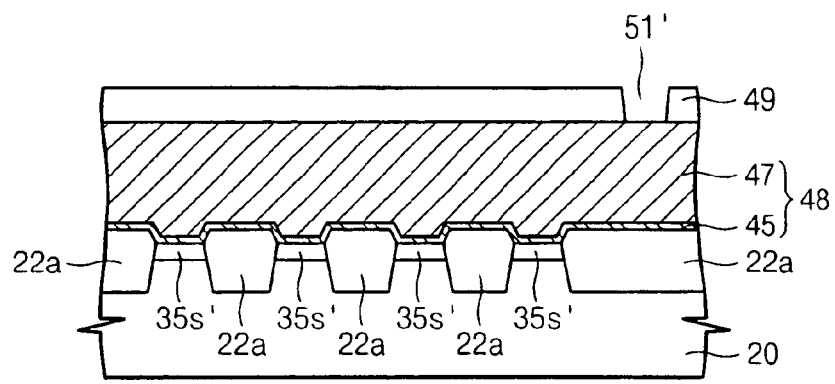
Figure 22B:
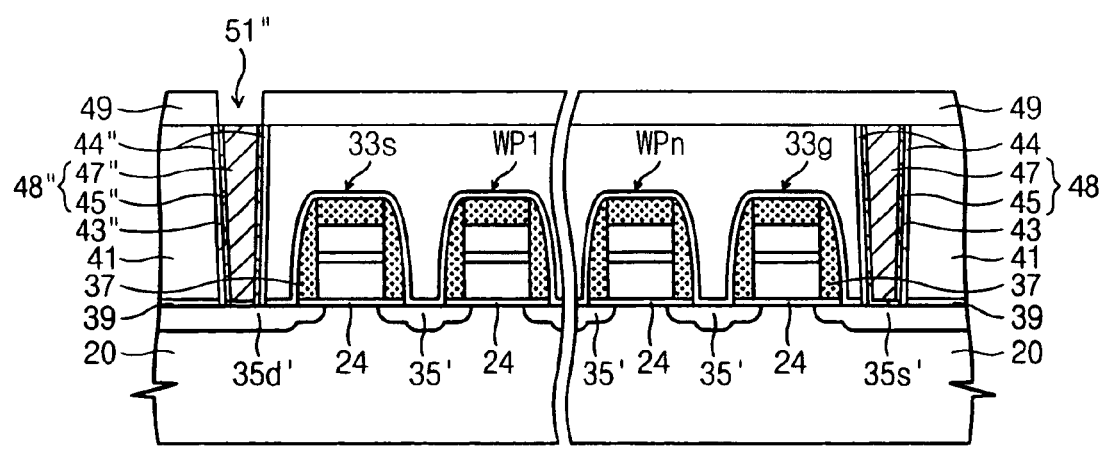
Figure 23A:
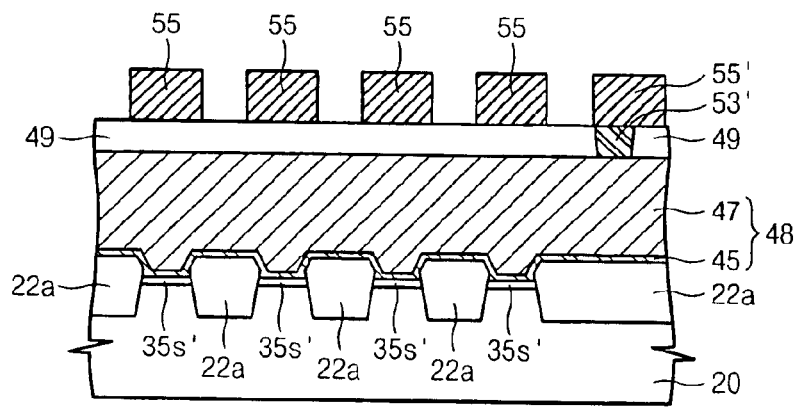
Figure 23B:
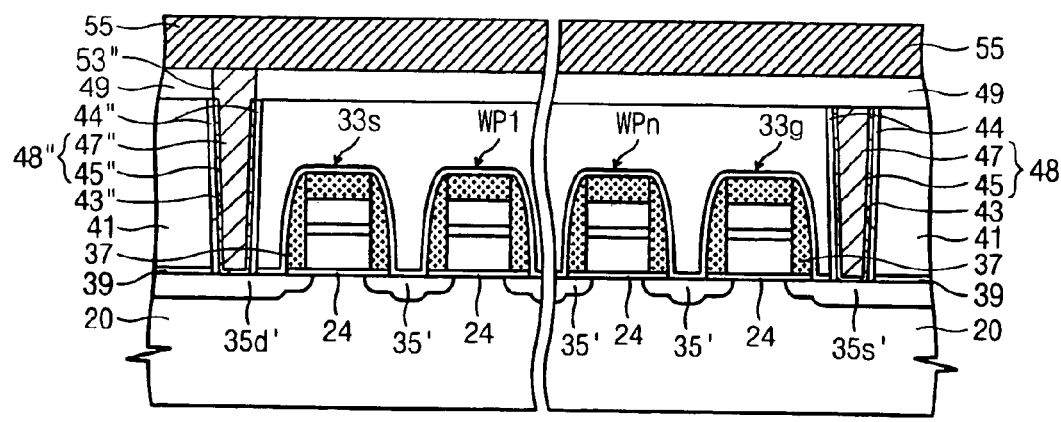

FIGS. 21A, 22A and 23A are cross-sectional views illustrating a method of fabricating the NAND-type flash memory device according to the embodiment of the present invention of FIGS. 20A and 20B, along line III–III' of FIG. 3B. FIGS. 21B, 22B and 23B are cross-sectional views illustrating a method of fabricating the NAND-type flash memory device according to the embodiment of the present invention shown in FIGS. 20A and 20B, along line IV–IV' of FIG. 3B. Description of the same components as those of the embodiment described in FIGS. 13A to 16A and 13B to 16B will not be repeated.

Referring to FIGS. 21A and 21B, a spacer is formed on sidewalls of the string selection line pattern 33s, the plurality of word line patterns WP1 to WPn, and the ground selection line pattern 33g.

An etch stop layer 39 and a first interlayer insulating layer 41 are sequentially formed on the entire surface of the resultant structure where the spacer 37 is formed. The first interlayer insulating layer 41 and the etch stop layer 39 are successively patterned to form a slit-type common source line contact hole 43 using the same manner as the first embodiment of the present invention. At the same time, a drain contact hole 43" exposing a drain region 35d' of the respective string is formed.

Referring to FIGS. 22A and 22B, barrier insulating layers 44 and 44" are formed on sidewalls of the common source line contact hole 43 and the drain contact hole 43", respectively. Conformal barrier metal layers 45 and 45" are formed on the entire surface of the resultant structure where the barrier insulating layer 44 and 44" are formed. A metal layer filling the common source line contact hole 43 and the drain contact hole 43" is formed on the entire surface of the resultant structure where the barrier metal layers 45 and 45" are formed. Then, the metal layer and the barrier metal layers 45 and 45" are planarly etched to form metal patterns 47 and 47" filling the common source line contact hole 43 and the drain contact hole 43". The common source line 48 and the drain contact plug 48", comprising the metal patterns 47 and 47", respectively, and the barrier metal layers 45 and 45", respectively, are surrounded with the barrier insulating layers 44 and 44", respectively.

A second interlayer insulating layer 49 is formed on the entire surface of the resultant structure where the common source line 48 and the drain contact plug 48" are formed. The second interlayer insulating layer 49 is patterned to form bit line contact hole 51 exposing the respective drain contact plug 48" and a source contact hole 51" exposing a predetermined region of the common source line 48. At this time, though not shown in the figures, metal contact holes of a peripheral circuit region can also be formed simultaneously when the bit line contact holes 51 are formed.

Referring to FIGS. 23A and 23B, a plurality of bit lines 55 running parallel with each other and a source strapping line 55' are formed on the second interlayer insulating layer in the same manner as the first embodiment of the present invention.

As previously mentioned, a common source line is formed using a metal layer having high cell current. As a result, it is possible to sufficiently secure cell current although a sectional area of the common source line is decreased.

Furthermore, mobile ions in a metal layer are prevented from being diffused to an interlayer insulating layer, so that the reduction of data retention of a flash memory cell can be prevented.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A NAND-type flash memory device comprising:
   a plurality of isolation layers formed at predetermined regions of a semiconductor substrate and running parallel with each other;
   a string selection line pattern and a ground selection line pattern crossing over the plurality of isolation layers and running parallel with each other;
   a plurality of word line patterns arranged between the string selection line pattern and the ground selection line pattern;
   source regions adjacent to the ground selection line pattern and formed at active regions opposite the string selection line pattern;
   an interlayer insulating layer covering the entire surface of the substrate where the string selection line pattern, the ground selection line pattern, and the plurality of word lines are formed, and having a slit-type common source line contact hole exposing the source regions and the isolation layers between the source lines;
   a barrier insulating layer formed on sidewalls of the slit-type common source line contact hole; and
   a metal common source line formed in the slit-type common source line contact hole where the barrier insulating layer is formed, and electrically connected to the source regions.

2. The NAND-type flash memory device of claim 1, wherein the metal common source line comprises:
   a barrier metal layer conformally formed in the slit-type common source line contact hole; and
   a metal pattern formed on the barrier metal layer to fill the slit-type common source line contact hole.

3. The NAND-type flash memory device of claim 2, wherein the barrier metal layer is formed of a titanium layer and a titanium nitride layer, the titanium layer and the titanium nitride layer being stacked.

4. The NAND-type flash memory device of claim 1, wherein the barrier insulating layer is formed of a silicon nitride layer.

5. The NAND-type flash memory device of claim 1, wherein the source regions in the slit-type common source line contact hole are recessed.

6. The NAND-type flash memory device of claim 5, wherein the barrier insulating layer is extended to a lower part to cover the recessed sidewalls of the source regions.

* * * * *